United States Patent
Schmaunz et al.

(10) Patent No.: US 11,347,043 B2
(45) Date of Patent: May 31, 2022

(54) OPERATING A PARTICLE BEAM APPARATUS AND/OR A LIGHT MICROSCOPE

(71) Applicant: Carl Zeiss Microscopy GmbH, Jena (DE)

(72) Inventors: Andreas Schmaunz, Oberkochen (DE); Gero Walter, Westhausen (DE); Stephan Hiller, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 17/083,742

(22) Filed: Oct. 29, 2020

(65) Prior Publication Data
US 2021/0271063 A1     Sep. 2, 2021

(30) Foreign Application Priority Data

Oct. 30, 2019 (DE) .......................... 102019216791.8

(51) Int. Cl.
*G02B 21/26* (2006.01)
*G02B 21/08* (2006.01)
(Continued)

(52) U.S. Cl.
CPC ............. *G02B 21/26* (2013.01); *G02B 21/08* (2013.01); *G02B 21/28* (2013.01); *G02B 21/30* (2013.01);
(Continued)

(58) Field of Classification Search
CPC ........ G02B 21/26; G02B 21/28; G02B 21/30; G02B 21/08; H01J 37/244; H01J 37/28;
(Continued)

(56) References Cited

U.S. PATENT DOCUMENTS

| | | | | | |
|---|---|---|---|---|---|
| 4,376,891 A | * | 3/1983 | Rauscher | .............. | H01J 37/295 250/307 |
| 4,563,883 A | * | 1/1986 | Sitte | .......................... | G01N 1/42 141/284 |

(Continued)

FOREIGN PATENT DOCUMENTS

| | | |
|---|---|---|
| DE | 10 2012 205 317 A1 | 10/2013 |
| EP | 2 573 794 A1 | 3/2013 |
| WO | WO 2002/067286 A2 | 8/2002 |

*Primary Examiner* — David A Vanore
(74) *Attorney, Agent, or Firm* — Muirhead and Saturnelli, LLC

(57) ABSTRACT

A particle beam apparatus and/or a light microscope is operated. A first temperature of an object may be changed, where the object may be arranged on an object receiving device rendered movable by a motor operated by a supply current. Changing the first temperature of the object may alter a second temperature of the object-receiving device from a first temperature value to a second temperature value. The supply current of the motor may be changed from a first current value to a second current value, where the supply current is designed to hold the object-receiving device in position, and a temperature of the object-receiving device may be changed from the second temperature value to a third temperature value on account of heat generated by the motor, which may be obtained by the second current value of the supply current and fed to the object receiving device.

26 Claims, 16 Drawing Sheets

(51) Int. Cl.
*G02B 21/28* (2006.01)
*G02B 21/30* (2006.01)
*H01J 37/20* (2006.01)
*H01J 37/244* (2006.01)
*H01J 37/28* (2006.01)

(52) U.S. Cl.
CPC ............ *H01J 37/20* (2013.01); *H01J 37/244* (2013.01); *H01J 37/28* (2013.01); *H01J 2237/2001* (2013.01); *H01J 2237/202* (2013.01)

(58) Field of Classification Search
CPC ............... H01J 37/20; H01J 2237/2001; H01J 2237/202
USPC .............................. 250/440.11, 441.1, 442.1
See application file for complete search history.

(56) References Cited

U.S. PATENT DOCUMENTS

| | | | | |
|---|---|---|---|---|
| 2004/0036031 A1* | 2/2004 | Rose | ...................... | H01J 37/153 250/396 R |
| 2012/0112064 A1* | 5/2012 | Nagakubo | .............. | G01N 1/286 250/307 |
| 2014/0001373 A1* | 1/2014 | Knappich | ............... | H01J 37/20 250/397 |

* cited by examiner

OPERATING A PARTICLE BEAM APPARATUS AND/OR A LIGHT MICROSCOPE

CROSS-REFERENCE TO RELATED APPLICATION

This application claims the priority of the German patent application No. 10 2019 216 791.8, filed on Oct. 30, 2019, which is incorporated herein by reference.

TECHNICAL FIELD

The system described herein relates to a method for operating a particle beam apparatus and/or a light microscope, to a computer program product and to a particle beam apparatus and a light microscope, by means of which this method is able to be carried out. The particle beam apparatus and/or the light microscope is/are designed to image, analyze and/or process an object. By way of example, the particle beam apparatus is embodied as an electron beam apparatus and/or as an ion beam apparatus.

BACKGROUND OF THE INVENTION

Electron beam apparatuses, in particular a scanning electron microscope (also referred to as SEM below) and/or a transmission electron microscope (also referred to as TEM below), are used to examine objects (samples) in order to obtain knowledge in respect of the properties and the behavior under certain conditions.

In an SEM, an electron beam (also referred to as primary electron beam below) is generated by means of a beam generator and focused onto an object to be examined by way of a beam guiding system. The primary electron beam is guided in a raster manner over a surface of the object to be examined by way of a deflection device. Here, the electrons of the primary electron beam interact with the object to be examined. Interaction particles and/or interaction radiation is/are generated as a result of the interaction. As interaction particles, electrons, in particular, are emitted by the object (so-called secondary electrons) and electrons of the primary electron beam are backscattered (so-called backscattered electrons) at the object. The secondary electrons and backscattered electrons are detected by a particle detector and used for image generation. An image representation of the object to be examined is thus obtained. In particular, x-ray radiation and/or cathodoluminescence arises as interaction radiation. The interaction radiation is detected with a radiation detector and is used to analyze the object, in particular.

In the case of a TEM, a primary electron beam is likewise generated by means of a beam generator and directed onto an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Here, imaging may also take place in the scanning mode of a TEM. As a rule, such a TEM is referred to as STEM. Additionally, provision can be made for detecting electrons backscattered at the object to be examined and/or secondary electrons emitted by the object to be examined by means of a further detector in order to image an object to be examined.

Furthermore, it is known from the prior art to use combination apparatuses for examining objects, wherein both electrons and ions can be guided onto an object to be examined. By way of example, it is known to equip an SEM additionally with an ion beam column. An ion beam generator arranged in the ion beam column generates ions that are used for preparing an object (for example removing material of the object or applying material to the object) or else for imaging. The SEM serves here in particular for observing the preparation, but also for further examination of the prepared or unprepared object.

The practice of arranging an object to be examined with a particle beam apparatus on an object holder, which in turn is arranged on an object stage, is known. The object stage is arranged in a sample chamber of the particle beam apparatus. The object stage has a movable embodiment, the movable embodiment of the object stage being ensured by a plurality of movement units, from which the object stage is assembled. The movement units facilitate a movement of the object stage in at least one specified direction. Object stages that have a plurality of translational movement units (e.g., approximately 3 to 4 translational movement units) and a plurality of rotational movement units (e.g., 2 to 3 rotational movement units), in particular, are known. By way of example, an object stage which is movably arranged along a first translation axis (for example, an x-axis), along a second translation axis (for example, a y-axis), and along a third translation axis (for example, a z-axis) is known. The first translation axis, the second translation axis and the third translation axis are oriented perpendicular to one another. Further, the known object stage is embodied to be rotatable about a first axis of rotation and about a second axis of rotation, which is aligned perpendicular to the first axis of rotation.

The driving force for a movement by means of the movement units is provided by stepper motors in the prior art. A respective stepper motor is provided for a respective movement along one of the translation axes or for a rotation about one of the axes of rotation. The stepper motors are arranged in the sample chamber of the particle beam apparatus or outside of the sample chamber of the particle beam apparatus. In the latter case, vacuum feedthroughs and mechanical devices are provided in order to ensure the actuation between the stepper motors and the object stage.

A stepper motor known from the prior art has the following basic setup: The stepper motor is provided with a rotor which is rotatably arranged within said stepper motor. Further, the stepper motor comprises coils which are arranged around the rotor. The coils provide a controlled, incrementally rotating electromagnetic field, by means of which the rotor can be rotated through a minimum angle or through a multiple of this minimum angle. This renders it possible to obtain a certain number of steps per revolution of the rotor. The prior art has disclosed stepper motors with a different number of steps per revolution of the rotor, for example with 100 steps per revolution. In the case of a stepper motor with 100 steps per revolution, the rotor rotates through 3.6° in the case of each full step, for example.

In addition to an operation in which the stepper motor carries out full steps, a so-called micro-step operation is also possible in the case of known stepper motors. Steps that are smaller than a full step are provided in the micro-step operation. To this end, the step angle is reduced. This is provided by controlling a supply current for the coils used in the stepper motor. Activating or deactivating the supply current at the individual coils of the stepper motor results in a stepped overall control current profile, which is provided by the ratios of the amplitudes of the supply current applied to the individual coils. Consequently, the stepper motor is actuated by a selectable actuation of the supply current for the individual coils used in the stepper motor. Full steps or smaller steps (e.g., half steps, eighth steps or smaller steps) can be obtained by way of a selectable phase-shifted actuation of the supply current for the individual coils of the stepper motor.

The prior art has likewise disclosed to use the stepper motor or stepper motors to hold the movable object stage at a certain position in a sample chamber in the particle beam apparatus. Expressed differently, the object stage should no longer move away from this specific position. This is desirable, in particular, for a good resolution and/or an accurate image representation of an object arranged on the object stage. When the stepper motor is stopped, the rotor remains in a specifiable position which is specified by one of the micro steps. In this position, the supply current assumes a value that is specified by an operational amplitude and operational phase of the supply current for the stepper motor required in this motor position. This operational amplitude is static. It can lead to an excess thermal load on the stepper motor, which is undesirable. For this reason, the prior art provides for the amplitude of the supply current to be reduced to a specifiable holding amplitude following this stop. The supply current with this holding amplitude is also referred to as a holding current. The heating of the components is acceptable in the case of the holding current.

Further, the prior art has disclosed the examination of a frozen object using an electron microscope. By way of example, this is advantageous when examining biological objects. To this end, the frozen object is arranged on an object holder, which is able to be cooled. By way of example, the object holder is able to be cooled to temperatures of less than or equal to 140° C. using liquid nitrogen. The aforementioned object holder is arranged on the object stage of the electron microscope. To prevent the object stage from cooling, a thermally insulated arrangement of the object holder on the object stage is known.

However, it was found that cooling of the object stage over time cannot be prevented. Since the object stage then no longer is in thermal equilibrium, a thermal expansion of the object stage arises. This leads to a drift of the positioning of the object stage, and so the object stage leaves the desired position in which the object stage should in fact be situated. Expressed differently, a drift of the object stage around a desired position of the object stage arises. The object stage then assumes a position that deviates from the desired position of the object stage. This is disadvantageous for good imaging, processing and/or analyzing of the object using an electron beam, since the spatial resolution becomes poorer and hence there is a reduction in the quality of the imaging, processing and/or analyzing of the object.

Measurements have shown that the drift of the object stage when the object holder cools to the aforementioned temperatures can be greater by a factor of 10 to 15 than the drift of the object stage prior to the cooling of the object holder. Once the object holder has cooled to a desired temperature and the object holder is left at said desired temperature, the drift of the object stage approximately has the value that the drift of the object stage had prior to the cooling of the object holder. However, the measurements also showed that the drift of the object stage increases again a certain time after the cooling of the object holder and only continuously reduces again over time.

The aforementioned disadvantages also exist if a cooled object holder is arranged on a movable object stage of a light microscope.

In respect of the prior art, reference is made by way of example to DE 10 2012 205 317 A1.

SUMMARY OF THE INVENTION

The system described herein may be based on the object of as quickly as possible bringing the drift of the object stage following the cooling of the object holder and after reaching a desired temperature of the object holder to values exhibited by the drift of the object stage prior to the cooling of the object holder.

An embodiment of the method according to the system described herein serves to operate a particle beam apparatus and/or a light microscope for imaging, analyzing and/or processing an object. By way of example, a particle beam may be generated by at least one particle beam generator of the particle beam apparatus. The particle beam may have charged particles. By way of example, the particles may be electrons or ions. In particular, provision may be made for the particle beam to be guided or focused onto the object by way of at least one objective lens. Interaction radiation and/or interaction particles may arise on account of an interaction between the particle beam and the object. By way of example, the interaction radiation may be x-ray radiation and/or cathodoluminescence. The interaction radiation may be detected using at least one radiation detector. The interaction particles are, for example, secondary particles emitted by the object, in particular secondary electrons, and/or backscattered particles, in particular backscattered electrons. These may be detected using at least one particle detector.

In an embodiment of the method according to the system described herein, provision may be made for a first temperature of an object to be changed. By way of example, the object may be cooled and/or heated from a first temperature value of the object to a second temperature value of the object. Accordingly, changing the first temperature of the object may comprise cooling and/or heating of the object, for example.

The object may be arranged on an object receiving device, with a movable embodiment, of the particle beam apparatus and/or of the light microscope. By way of example, the object may be arranged directly on the object receiving device or arranged on the object receiving device by arranging an intermediate component between the object and the object receiving device. By way of example, the object receiving device may be a manipulator, an object stage and/or a holding device for holding and/or gripping the object. At least one motor may be provided for moving the object receiving device, said motor being operated with a supply current. By way of example, the object receiving device may be embodied to be movable along a first translation axis (in particular an x-axis), along a second translation axis (in particular a y-axis), and along a third translation axis (in particular a z-axis). By way of example, the first translation axis, the second translation axis, and the third translation axis are oriented perpendicular to one another. Further, the object receiving device may be, for example, embodied to be rotatable about a first axis of rotation and about a second axis of rotation, which may be aligned perpendicular to the first axis of rotation. In one embodiment of the method according to the system described herein, a respective motor may be provided for each of the aforementioned axes, said motor facilitating the movement of the object receiving device along the corresponding axis.

The changing of the first temperature of the object may bring about a change in a second temperature of the object receiving device from a first temperature value of the object receiving device to a second temperature value of the object receiving device. Expressed differently, a change in the first temperature of the object also may bring about a change in the second temperature of the object receiving device.

An embodiment of the method according to the system described herein now provides for the supply current of the motor to be changed from a first current value to a second current value. Here, the supply current with the first current value or the second current value may be used to hold the object receiving device by means of the motor at a desired position of the object receiving device in the particle beam apparatus and/or in the light microscope. Expressed differently, the supply current with the first current value or the second current value may be a holding current. The object receiving device may be held by means of the motor at the desired position of the object receiving device in the particle beam apparatus and/or in the light microscope in the case of both the first current value of the supply current and the second current value of the supply current. When the holding current is supplied to the motor, the object receiving device may be held at the desired position of the object receiving device in the particle beam apparatus and/or in the light microscope on account of the motor and may be positioned accordingly. By way of example, the object receiving device may be arranged in a sample chamber of the particle beam apparatus and/or of the light microscope. Consequently, when the holding current is supplied to the motor, the object receiving device may be held at the desired position of the object receiving device in the sample chamber of the particle beam apparatus and/or of the light microscope on account of the motor and may be positioned accordingly.

In an embodiment of the method according to the system described herein, provision is moreover made for the second temperature of the object receiving device to be changed from the second temperature value of the object receiving device to a third temperature value of the object receiving device on account of heat generated by the motor, which may be obtained by the second current value of the supply current and which may be supplied to the object receiving device. The third temperature value of the object receiving device may lie in a temperature range, to which the following applies:

$$TOT1-15°\ C. \leq TOT3 \leq TOT1+15°\ C. \qquad [1],$$

where
TOT1 is the first temperature value of the object receiving device, and where
TOT3 is the third temperature value of the object receiving device.

Expressed differently, the third temperature value of the object receiving device may lie in a range of ±15° C. around the first temperature value of the object stage.

An embodiment of the method according to the system described herein is based on the surprising discovery that the heat generated by the motors provided for moving and positioning the object receiving device may be used in such a way that a change in the second temperature of the object receiving device is counteracted. The larger the second current value of the supply current, the greater the heat generated by the motor. By way of example, the second temperature of the object receiving device may be increased by means of the heat of the motors should the second temperature of the object receiving device drop inadvertently. Alternatively, the second temperature of the object receiving device may be reduced by means of the heat of the motors should the second temperature of the object receiving device increase inadvertently. In the latter case, less heat, for example, may be generated by the motors and supplied to the object receiving device, and so the second temperature of the object receiving device may be reduced.

An embodiment of the method according to the system described herein facilitates a reduction and/or minimization of the influence of the change in the first temperature of the object on the second temperature of the object receiving device. As a result of the reduction and/or minimization of this influence, there may be no change, or only a small change, in the second temperature of the object receiving device, and so a thermal length change of the object receiving device and a drift of the object receiving device accompanying this may be reduced in comparison with the prior art. Consequently, it may be possible to as quickly as possible bring the drift of the object receiving device following cooling of the object and after reaching a desired temperature of the object to values exhibited by the drift of the object receiving device prior to the cooling of the object.

In one embodiment of the method according to the system described herein, provision is made, additionally or alternatively, for the object to be arranged on an object holder. The object holder may be arranged on the object receiving device. By way of example, the object receiving device is embodied as an object stage in this embodiment. The changing of the first temperature of the object may comprise a changing of a third temperature of the object holder from a first temperature value of the object holder to a second temperature value of the object holder. By way of example, the object holder is cooled and/or heated from the first temperature value of the object holder to the second temperature value of the object holder. Accordingly, changing the third temperature of the object holder may comprise cooling and/or heating of the object holder, for example. By way of example, the object holder is arranged on the object stage, with a movable embodiment, of the particle beam apparatus and/or of the light microscope. This embodiment, too, has the advantages already mentioned above, in particular.

In one embodiment of the method according to the system described herein, provision is additionally or alternatively made for the changing of the third temperature of the object holder to be implemented by cooling or heating the object holder. By way of example, at least one cooling and/or heating device of the particle beam apparatus and/or of the light microscope is used to this end, said at least one cooling and/or heating device acting on the object holder and/or being arranged on the object holder.

In a further embodiment of the method according to the system described herein, provision is additionally or alternatively made for the changing of the first temperature of the object to be implemented by cooling or heating the object. By way of example, at least one cooling and/or heating device of the particle beam apparatus and/or of the light microscope is used to this end, said at least one cooling and/or heating device acting on the object and/or being arranged on the object.

In a further embodiment of the method according to the system described herein, provision is additionally or alternatively made for a stepper motor to be used as a motor, wherein the supply current may be a holding current of the stepper motor. By way of example, the stepper motor has the embodiment set forth below. The stepper motor may be provided with a rotor which may be rotatably arranged within said stepper motor. Further, the stepper motor may comprise coils which are arranged around the rotor. The coils provide a controlled, incrementally rotating electromagnetic field, by means of which the rotor may be rotated through a minimum angle or through a multiple of this minimum angle. This renders it possible to obtain a certain number of steps per revolution of the rotor. By way of example, the stepper motor provides 100 steps per revolution. In the case of a stepper motor with 100 steps per revolution, the rotor rotates through 3.6° in the case of each full step, for example. In addition to an operation in which the stepper motor carries out full steps, a so-called microstep operation is also possible in the case of this stepper motor. Reference is made to the statements provided above, which also apply in this case.

In yet a further embodiment of the method according to the system described herein, provision is additionally or alternatively made for a brushless motor to be used as a motor, wherein the supply current may be a holding current of the brushless motor.

Explicit reference is made to the fact that the system described herein is not restricted to the use of a stepper motor or a brushless motor. Rather, any motor which is actuated by a current and which emits heat may be used for the system described herein.

In once again a further embodiment of the method according to the system described herein, provision is additionally or alternatively made for the object to be cooled and the supply current to be changed when the first temperature of the object is changed, such that the following applies: TOT1>TOT2 and TOT2<TOT3, where TOT2 is the second temperature value of the object receiving device. Expressed differently, the object receiving device may be cooled and the supply current may be changed when the first temperature of the object is changed, such that two conditions are satisfied. Firstly, the first temperature value of the object receiving device may be greater than the second temperature value of the object receiving device. Secondly, the second temperature value of the object receiving device may be less than the third temperature value of the object receiving device.

In one embodiment of the method according to the system described herein, provision is additionally or alternatively made for the object to be cooled with liquid nitrogen and the supply current to be changed when the first temperature of the object is changed, such that the following applies: TOT1>TOT2 and TOT2<TOT3, where TOT2 is the second temperature value of the object receiving device. In this embodiment, too, provision may be also made for the object to be cooled and for the supply current to be changed when the first temperature of the object is changed, such that two conditions are satisfied. Firstly, the first temperature value of the object receiving device may be greater than the second temperature value of the object receiving device. Secondly, the second temperature value of the object receiving device may be less than the third temperature value of the object receiving device.

In a further embodiment of the method according to the system described herein, provision is additionally or alternatively made for the object to be cooled with liquid helium and the supply current to be changed when the first temperature of the object is changed, such that the following applies: TOT1>TOT2 and TOT2<TOT3, where TOT2 is the second temperature value of the object receiving device. In this embodiment, too, provision also may be made for the object to be cooled and for the supply current to be changed when the first temperature of the object is changed, such that two conditions are satisfied. Firstly, the first temperature value of the object receiving device may be greater than the second temperature value of the object receiving device. Secondly, the second temperature value of the object receiving device may be less than the third temperature value of the object receiving device.

In yet a further embodiment of the method according to the system described herein, provision is additionally or alternatively made for the changing of the second temperature of the object receiving device from the second temperature value of the object receiving device to the third temperature value of the object receiving device to be implemented in such a way that the third temperature value of the object receiving device corresponds to the first temperature value of the object receiving device. Expressed differently, a change in the second temperature of the object receiving device may be counteracted by the heat generated by the motor in such a way that the second temperature of the object receiving device re-adopts the original temperature value or substantially the original temperature value before the first temperature of the object receiving device was changed, the original temperature value corresponding to the first temperature value of the object receiving device. In this embodiment of the method according to the system described herein, a drift of the object receiving device that occurred before the change in the first temperature of the object may be substantially obtained.

In once again a further embodiment of the method according to the system described herein, provision is additionally or alternatively made for the change of the second temperature of the object receiving device from the second temperature value to the third temperature value to be implemented such that the following applies: TOT1−15° C.≤TOT3≤TOT1. Expressed differently, the third temperature value of the object receiving device may lie in a range which may be bounded by a temperature 15° C. below the first temperature value of the object receiving device and by the first temperature value of the object receiving device itself. The range boundaries may be included in the range in this case. In yet a further embodiment of the method according to the system described herein, provision is additionally or alternatively made for the change of the second temperature of the object receiving device from the second temperature value to the third temperature value to be implemented such that the following applies: TOT1≤TOT3≤TOT1+15° C. Expressed differently, the third temperature value of the object receiving device may lie in a range which may be bounded by the first temperature value of the object receiving device itself and by a temperature 15° C. above the first temperature value of the object receiving device. Here too, the range boundaries may be included in the range.

In one embodiment of the method according to the system described herein, provision is made, additionally or alternatively, for the supply current to be changed in such a way that the following applies: I2>I1, where I1 is the first current value of the supply current and where I2 is the second current value of the supply current. Expressed differently, the supply current of the motor for holding the object receiving device by means of the motor at a position in the particle beam apparatus and/or in the light microscope may be changed in such a way that the second current value of the supply current is greater than the first current value of the supply current. As a result, more heat may be generated by the motor, said heat being supplied to the object receiving device.

In a further embodiment of the method according to the system described herein, provision is made, additionally or alternatively, for the supply current to be changed in such a way that the following applies: I1>I2, where I1 is the first current value of the supply current and where I2 is the second current value of the supply current. Expressed differently, the supply current of the motor for holding the object receiving device by means of the motor at a position in the particle beam apparatus and/or in the light microscope may be changed in such a way that the second current value of the supply current is less than the first current value of the supply current. As a result, less heat may be generated by the motor, said heat being supplied to the object receiving device.

In yet a further embodiment of the method according to the system described herein, provision is made, additionally or alternatively, for the supply current to be changed in such a way that the following applies: I2>I1, where I1 is the first current value of the supply current and where I2 is the second current value of the supply current. This embodiment of the method according to the system described herein may be distinguished by the additional feature that the supply current may be kept constant at the second current value after the second current value of the supply current has been reached. By way of example, provision may additionally be made for the supply current to be changed from the second current value back to the first current value of the supply current again after the change of the first temperature of the object has been completed (in particular, after a cooling of the object holder has been completed). This will be discussed again below.

In one embodiment of the method according to the system described herein, provision is made, additionally or alternatively, for the supply current to be changed in such a way that the following applies: I1>I2, where I1 is the first current value of the supply current and where I2 is the second current value of the supply current. This embodiment of the method according to the system described herein may be distinguished by the additional feature that the supply current may be kept constant at the second current value after the second current value of the supply current has been reached. By way of example, provision may additionally be made for the supply current to be changed from the second current value back to the first current value of the supply current again after the change of the first temperature of the object has been completed (in particular, after a heating of the object holder has been completed). This will be discussed again below.

In an in turn further embodiment of the method according to the system described herein, provision is additionally or alternatively made for the supply current to be changed when the first temperature of the object reaches or drops below a first specifiable temperature value when changing the first temperature of the object. By way of example, if the object is cooled and the first temperature of the object reaches the first specifiable temperature value, then the supply current may be changed as explained above and below. Alternatively, this embodiment of the method according to the system described herein provides for the supply current to be changed when the object is cooled and the first temperature of the object drops below the first specifiable temperature value. In the aforementioned embodiments, provision may be made for the supply current to be changed in such a way that the following applies: I2>I1, where I1 is the first current value of the supply current and where I2 is the second current value of the supply current. Expressed differently, the supply current of the motor for holding the object receiving device by means of the motor at a position in the particle beam apparatus and/or in the light microscope may be changed in such a way that the second current value of the supply current is greater than the first current value of the supply current. As a result, more heat may be generated by the motor, said heat being supplied to the object receiving device.

In one embodiment of the method according to the system described herein, provision is additionally or alternatively made for the supply current to be changed when the first temperature of the object reaches or exceeds a second specifiable temperature value when changing the first temperature of the object. By way of example, if the object is heated and the first temperature of the object reaches the first specifiable temperature value, then the supply current may be changed as explained above or below. Alternatively, this embodiment of the method according to the system described herein provides for the supply current to be changed when the object is heated and the first temperature of the object exceeds the first specifiable temperature value. In the aforementioned embodiments, provision may be made for the supply current to be changed in such a way that the following applies: I1>I2, where I1 is the first current value of the supply current and where I2 is the second current value of the supply current. Expressed differently, the supply current of the motor for holding the object receiving device by means of the motor at a position in the particle beam apparatus and/or in the light microscope may be changed in such a way that the first current value of the supply current may be greater than the second current value of the supply current. As a result, less heat may be generated by the motor, said heat being supplied to the object receiving device.

In an in turn further embodiment of the method according to the system described herein, provision is additionally or alternatively made for the supply current to be changed when the third temperature of the object holder reaches or drops below a first specifiable temperature value when changing the third temperature of the object holder. By way of example, if the object holder is cooled and the third temperature of the object holder reaches the first specifiable temperature value, then the supply current may be changed as explained above and below. Alternatively, this embodiment of the method according to the system described herein provides for the supply current to be changed when the object holder is cooled and the third temperature of the object holder drops below the first specifiable temperature value. In the aforementioned embodiments, provision may be made for the supply current to be changed in such a way that the following applies: I2>I1, where I1 is the first current value of the supply current and where I2 is the second current value of the supply current. Expressed differently, the supply current of the motor for holding the object receiving device by means of the motor at a position in the particle beam apparatus and/or in the light microscope may be changed in such a way that the second current value of the supply current is greater than the first current value of the supply current. As a result, more heat may be generated by the motor, said heat being supplied to the object receiving device.

In one embodiment of the method according to the system described herein, provision is additionally or alternatively made for the supply current to be changed when the third temperature of the object holder reaches or exceeds a second specifiable temperature value when changing the third temperature of the object holder. By way of example, if the object holder is heated and the first temperature of the object holder reaches the first specifiable temperature value, then the supply current may be changed as explained above or below. Alternatively, this embodiment of the method according to the system described herein provides for the supply current to be changed when the object holder is heated and the third temperature of the object holder exceeds the first specifiable temperature value. In the aforementioned embodiments, provision may be made for the supply current to be changed in such a way that the following applies: I1>I2, where I1 is the first current value of the supply current and where I2 is the second current value of the supply current. Expressed differently, the supply current of the motor for holding the object receiving device by means of the motor at a position in the particle beam apparatus and/or in the light microscope may be changed in such a way that the first current value of the supply current may be greater than the second current value of the supply current. As a result, less heat may be generated by the motor, said heat being supplied to the object receiving device.

In a further embodiment of the method according to the system described herein, provision is additionally or alternatively made for the supply current of the motor to be changed from the second current value to the first current value if two conditions are satisfied: (i) The changing of the first temperature of the object has been completed and (ii) the first temperature of the object adopts a third temperature value which lies in the range between the first temperature value and the second temperature value of the object. If the changing of the first temperature of the object has been completed and if the first temperature of the object is moving back in the direction of the original first temperature value, then the supply current of the motor may be changed from the second current value back to the original current value, specifically the first current value. As a result, the object receiving device may not be heated unnecessarily.

In yet a further embodiment of the method according to the system described herein, provision is additionally or alternatively made for the supply current of the motor to be changed from the second current value to the first current value if three conditions are satisfied: (i) The changing of the first temperature of the object has been completed, (ii) the first temperature of the object adopts a third temperature value which lies in the range between the first temperature value and the second temperature value of the object, and (iii) a specifiable time duration after the completion of the change of the first temperature of the object has elapsed. Expressed differently, if the changing of the first temperature of the object has been completed and if the first temperature of the object is moving back in the direction of the original first temperature value, then the supply current of the motor may be changed from the second current value back to the original current value, specifically the first current value, after the specifiable duration has elapsed. As a result of this, too, the object receiving device may not be heated unnecessarily.

In an in turn further embodiment of the method according to the system described herein, provision is additionally or alternatively made for the supply current of the motor to be changed from the second current value to the first current value if two conditions are satisfied: (i) The changing of the first temperature of the object has been completed and (ii) the first temperature of the object reaches or exceeds a specifiable first temperature threshold. This embodiment of the method according to the system described herein may be advantageous, in particular, if the object heats up again after being cooled. Then, the supply current of the motor may be changed from the second current value back to the original current value, specifically the first current value. As a result, the object receiving device may not be heated unnecessarily.

In one embodiment of the method according to the system described herein, provision is additionally or alternatively made for the supply current of the motor to be changed from the second current value to the first current value if two conditions are satisfied: (i) The changing of the first temperature of the object has been completed and (ii) the first temperature of the object reaches or drops below a second specifiable temperature threshold. This embodiment of the method according to the system described herein may be advantageous, in particular, if the object cools down again after being heated. Then, the supply current of the motor may be changed from the second current value back to the original current value, specifically the first current value. As a result, the object receiving device may not be cooled unnecessarily.

In a further embodiment of the method according to the system described herein, provision is additionally or alternatively made for the supply current of the motor to be changed from the second current value to the first current value if two conditions are satisfied: (i) The changing of the third temperature of the object holder has been completed and (ii) the third temperature of the object holder adopts a third temperature value which lies in the range between the first temperature value and the second temperature value of the object holder. If the changing of the third temperature of the object holder has been completed and if the third temperature of the object holder is moving back in the direction of the original first temperature value, then the supply current of the motor may be changed from the second current value back to the original current value, specifically the first current value. As a result, the object receiving device may not be heated unnecessarily.

In yet a further embodiment of the method according to the system described herein, provision is additionally or alternatively made for the supply current of the motor to be changed from the second current value to the first current value if three conditions are satisfied: (i) The changing of the third temperature of the object holder has been completed, (ii) the third temperature of the object holder adopts a third temperature value which lies in the range between the first temperature value and the second temperature value of the object holder, and (iii) a specifiable time duration after the completion of the change of the third temperature of the object holder has elapsed. Expressed differently, if the changing of the third temperature of the object holder has been completed and if the third temperature of the object holder is moving back in the direction of the original first temperature value, then the supply current of the motor may be changed from the second current value back to the original current value, specifically the first current value, after the specifiable duration has elapsed. As a result of this, too, the object receiving device may not be heated unnecessarily.

In an in turn further embodiment of the method according to the system described herein, provision is additionally or alternatively made for the supply current of the motor to be changed from the second current value to the first current value if two conditions are satisfied: (i) The changing of the third temperature of the object holder has been completed and (ii) the third temperature of the object holder reaches or exceeds a specifiable first temperature threshold. This embodiment of the method according to the system described herein may be advantageous, in particular, if the object holder heats up again after being cooled. Then, the supply current of the motor may be changed from the second current value back to the original current value, specifically the first current value. As a result, the object receiving device may not be heated unnecessarily.

In one embodiment of the method according to the system described herein, provision is additionally or alternatively made for the supply current of the motor to be changed from the second current value to the first current value if two conditions are satisfied: (i) The changing of the third temperature of the object holder has been completed and (ii) the third temperature of the object holder reaches or drops below a second specifiable temperature threshold. This embodiment of the method according to the system described herein may be advantageous, in particular, if the object holder cools down again after being heated. Then, the supply current of the motor may be changed from the second current value back to the original current value, specifically the first current value. As a result, the object receiving device may not be cooled unnecessarily.

In a further embodiment of the method according to the system described herein, provision is additionally or alternatively made for the value that the second current value of the supply current should have so that the second temperature of the object receiving device has the third temperature value to be determined before the first temperature of the object may be changed. This method step of the embodiment of the method according to the system described herein need not necessarily be carried out by a user of the particle beam apparatus and/or of the light microscope. Rather, this method step also may be undertaken in the factory of a producer of the particle beam apparatus and/or of the light microscope. By way of example, provision may be made for values for the second current value of the supply current to be stored in a database as a function of the second temperature of the object receiving device and of the first temperature of the object. Here, the second current value of the supply current may be initially loaded from the database into a control unit of the particle beam apparatus as a function of a desired value of the third temperature value of the object receiving device and as a function of a second temperature value of the object present. The loaded second current value of the supply current then may be fed to the motor in such a way that heat generated then by the motor influences the second temperature of the object receiving device in such a way that the second temperature of the object receiving device may be set to the third temperature value of the object receiving device.

In an in turn further embodiment of the method according to the system described herein, provision is made, additionally or alternatively, for the determination of the second current value of the supply current to include the following steps:
  setting the first temperature of the object to a plurality of different second temperature values of the object; and
  determining the second current value of the supply current for each of the plurality of different second temperature values of the object, wherein the change of the second temperature of the object receiving device from the second temperature value of the object receiving device to the third temperature value of the object receiving device may be obtained when the determined second current value is fed to the motor.

In particular, provision may be made for the determination of the value of the second current value of the supply current to include a determination of a functional relationship, by way of extrapolation and/or interpolation, between the different second temperature values of the object and the determined second current values of the supply current and the third temperature value of the object receiving device to be obtained. Any suitable interpolation method, for example a linear interpolation, a nonlinear interpolation, a trigonometric interpolation, a logarithmic interpolation and/or a spline interpolation, may be used in the interpolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the first value and the second value.

In a further embodiment of the method according to the system described herein, provision is additionally or alternatively made for the value that the second current value of the supply current should have so that the second temperature of the object receiving device has the third temperature value to be determined before the third temperature of the object holder may be changed. This method step of the embodiment of the method according to the system described herein need not necessarily be carried out by a user of the particle beam apparatus and/or of the light microscope. Rather, this method step also may be undertaken in the factory of a producer of the particle beam apparatus and/or of the light microscope. By way of example, provision may be made for values for the second current value of the supply current to be stored in a database as a function of the second temperature of the object receiving device and of the third temperature of the object holder. Here, the second current value of the supply current may be initially loaded from the database into a control unit of the particle beam apparatus as a function of a desired value of the third temperature value of the object receiving device and as a function of a second temperature value of the object holder present. The loaded second current value of the supply current then may be fed to the motor in such a way that heat generated then by the motor influences the second temperature of the object receiving device in such a way that the second temperature of the object receiving device may be set to the third temperature value of the object receiving device.

In an in turn further embodiment of the method according to the system described herein, provision is made, additionally or alternatively, for the determination of the value of the second current value of the supply current to include the following steps:
  setting the third temperature of the object holder to a plurality of different second temperature values of the object holder; and
  determining the second current value of the supply current for each of the plurality of different second temperature values of the object holder, wherein the change of the second temperature of the object receiving device from the second temperature value of the object receiving device to the third temperature value of the object receiving device may be obtained when the determined second current value is fed to the motor.

In particular, provision may be made for the determination of the value of the second current value of the supply current to include a determination of a functional relationship, by way of extrapolation and/or interpolation, between the different second temperature values of the object holder and the determined second current values of the supply current and the third temperature value of the object receiving device to be obtained. Any suitable interpolation method, for example a linear interpolation, a nonlinear interpolation, a trigonometric interpolation, a logarithmic interpolation and/or a spline interpolation, may be used in the interpolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the first value and the second value.

Embodiments of the system described herein include a computer program product comprising program code, which is loadable or loaded into a processor of a particle beam apparatus and/or a light microscope, wherein the program code, when executed on the processor, controls the particle beam apparatus and/or light microscope in such a way that a method having at least one of the aforementioned or following features or having a combination of at least two of the aforementioned or following features is carried out.

Embodiments of the system described herein include a particle beam apparatus for imaging, analyzing and/or processing an object. The particle beam apparatus may comprise at least one beam generator for generating a particle beam with charged particles. By way of example, the charged particles are electrons or ions. Further, the particle beam apparatus may be provided with at least one objective lens for focusing the particle beam onto the object. Moreover, the particle beam apparatus may comprise, e.g., at least one scanning device for scanning the particle beam over the object. Further, the particle beam apparatus may be provided with at least one object holder for holding the object. The particle beam apparatus according to an embodiment of the system described herein may comprise at least one temperature device in the form of a cooling and/or heating device for changing the temperature of the object holder and/or of the object. By way of example, the temperature device may be embodied as cooling or heating device.

Moreover, the particle beam apparatus according to an embodiment of the system described herein is embodied with at least one movably embodied object receiving device. By way of example, the object receiving device may be embodied as an object stage, on which the object holder, in particular, may be arranged. Further, the particle beam apparatus according to an embodiment of the system described herein comprises at least one motor for moving the object receiving device. Moreover, the particle beam apparatus according to an embodiment of the system described herein comprises at least one power supply unit, by means of which a supply current may be fed to the motor.

The object receiving device of the particle beam apparatus according to an embodiment of the system described herein may be embodied to be movable along a first translation axis (in particular an x-axis), along a second translation axis (in particular a y-axis), and along a third translation axis (in particular a z-axis), for example. By way of example, the first translation axis, the second translation axis, and the third translation axis are oriented perpendicular to one another. Further, the object receiving device is for example embodied to be rotatable about a first axis of rotation and about a second axis of rotation, which may be aligned perpendicular to the first axis of rotation. In one embodiment of the particle beam apparatus according to the system described herein, a respective motor is provided for each of the aforementioned axes, said motor facilitating the movement along the corresponding axis.

Further, the particle beam apparatus according to an embodiment of the system described herein is provided with at least one detector for detecting interaction particles and/or interaction radiation, which result/results from an interaction of the particle beam with the object. Additionally, the particle beam apparatus according to an embodiment of the system described herein is provided with at least one display device for displaying an image and/or a result of an analysis of the object. Moreover, the particle beam apparatus according to an embodiment of the system described herein comprises at least one control unit with a processor, onto which an aforementioned computer program product has been loaded.

In one embodiment of the particle beam apparatus according to the system described herein, provision is additionally or alternatively made for the motor to be embodied as a stepper motor, wherein the supply current may be a holding current of the stepper motor. By way of example, the stepper motor has the embodiment set forth below. The stepper motor may be provided with a rotor which may be rotatably arranged within said stepper motor. Further, the stepper motor may comprise coils which are arranged around the rotor. The coils provide a controlled, incrementally rotating electromagnetic field, by means of which the rotor may be rotated through a minimum angle or through a multiple of this minimum angle. This renders it possible to obtain a certain number of steps per revolution of the rotor. By way of example, the stepper motor provides 100 steps per revolution. In the case of a stepper motor with 100 steps per revolution, the rotor rotates through 3.6° in the case of each full step, for example. In addition to an operation in which the stepper motor carries out full steps, a so-called micro-step operation also may be possible in the case of this stepper motor. Steps that are smaller than a full step may be provided in the micro-step operation. To this end, the step angle may be reduced. Reference is made to the explanations provided above, which also apply in this case.

In a further embodiment of the particle beam apparatus according to the invention, provision is additionally or alternatively made for the motor to be embodied as a brushless motor, wherein the supply current may be a holding current of the brushless motor.

Explicit reference is made to the fact that the system described herein is not restricted to the use of a stepper motor or a brushless motor. Rather, any motor which is actuated by a current and emits heat may be used for the system described herein.

In an in turn further embodiment of the particle beam apparatus according to the invention, provision is made, additionally or alternatively, for the particle beam apparatus to comprise at least one temperature measuring unit for measuring the temperature of the object holder and/or of the object receiving device and/or of the object. By way of example, the temperature measuring unit may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

In one embodiment of the particle beam apparatus according to the system described herein, provision is made, additionally or alternatively, for the beam generator to be embodied as a first beam generator, wherein the particle beam may be embodied as a first particle beam with first charged particles, and wherein the objective lens may be embodied as a first objective lens for focusing the first particle beam onto the object. Further, the particle beam apparatus may comprise at least one second beam generator for generating a second particle beam with second charged particles, and at least one second objective lens for focusing the second particle beam onto the object.

In a further embodiment of the particle beam apparatus according to the system described herein, provision is made for the particle beam apparatus to be an electron beam apparatus and/or an ion beam apparatus.

Embodiments of the system described herein may include a light microscope for imaging, analyzing and/or processing an object. The light microscope may comprise at least one light source for generating light and at least one optical unit for guiding the light to an object. Further, the light microscope according to an embodiment of the system described herein is provided with at least one object holder for holding the object. The light microscope according to an embodiment of the system described herein comprises at least one temperature device in the form of a cooling and/or heating device for changing the temperature of the object holder and/or of the object. By way of example, the temperature device is embodied as cooling or heating device.

Moreover, the light microscope according to an embodiment of the system described herein is embodied with at least one movably embodied object receiving device. By way of example, the object receiving device may be embodied as an object stage, on which the object holder, in particular, may be arranged. Further, the light microscope according to an embodiment of the system described herein comprises at least one motor for moving the object receiving device. Moreover, the light microscope according to an embodiment of the system described herein comprises at least one power supply unit, by means of which a supply current may be fed to the motor.

The object receiving device of the light microscope according to an embodiment of the system described herein is embodied to be movable along a first translation axis (in particular an x-axis), along a second translation axis (in particular a y-axis), and along a third translation axis (in particular a z-axis), for example. By way of example, the first translation axis, the second translation axis, and the third translation axis are oriented perpendicular to one another. Further, the object receiving device is for example embodied to be rotatable about a first axis of rotation and about a second axis of rotation, which may be aligned perpendicular to the first axis of rotation. In one embodiment of the light microscope according to an embodiment of the system described herein, a respective motor is provided for each of the aforementioned axes, said motor facilitating the movement along the corresponding axis.

Moreover, the light microscope according to an embodiment of the system described herein comprises at least one control unit with a processor, onto which an aforementioned computer program product has been loaded.

In one embodiment of the light microscope according to the invention, provision is additionally or alternatively made for the motor to be embodied as a stepper motor, wherein the supply current may be a holding current of the stepper motor. By way of example, the stepper motor has the embodiment set forth below. The stepper motor may be provided with a rotor which may be rotatably arranged within said stepper motor. Further, the stepper motor may comprise coils which are arranged around the rotor. The coils provide a controlled, incrementally rotating electromagnetic field, by means of which the rotor may be rotated through a minimum angle or through a multiple of this minimum angle. This renders it possible to obtain a certain number of steps per revolution of the rotor. By way of example, the stepper motor provides 100 steps per revolution. In the case of a stepper motor with 100 steps per revolution, the rotor rotates through 3.6° in the case of each full step, for example. In addition to an operation in which the stepper motor carries out full steps, a so-called micro-step operation is also possible in the case of this stepper motor. Steps that are smaller than a full step may be provided in the micro-step operation. To this end, the step angle may be reduced. Reference is made to the explanations provided above, which also apply in this case.

In a further embodiment of the light microscope according to the invention, provision is additionally or alternatively made for the motor to be embodied as a brushless motor, wherein the supply current may be a holding current of the brushless motor.

Explicit reference is made to the fact that the system described herein is not restricted to the use of a stepper motor or a brushless motor. Rather, any motor which is actuated by a current and emits heat may be used for the system described herein.

In an in turn further embodiment of the light microscope according to the invention, provision is made, additionally or alternatively, for the light microscope to comprise at least one temperature measuring unit for measuring the temperature of the object holder and/or of the object receiving device and/or of the object. By way of example, the temperature measuring unit may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

BRIEF DESCRIPTION OF THE DRAWINGS

The system described herein will be explained in more detail below on the basis of embodiments using drawings. In detail.

DESCRIPTION OF VARIOUS EMBODIMENTS

Embodiments of the system described herein are now explained in more detail by means of particle beam apparatuses in the form of an SEM and in the form of a combination apparatus, which may have an electron beam column and an ion beam column. Reference is explicitly made to the fact that the system described herein may be used in any particle beam apparatus, in particular in any electron beam apparatus and/or any ion beam apparatus.

Figure 1:
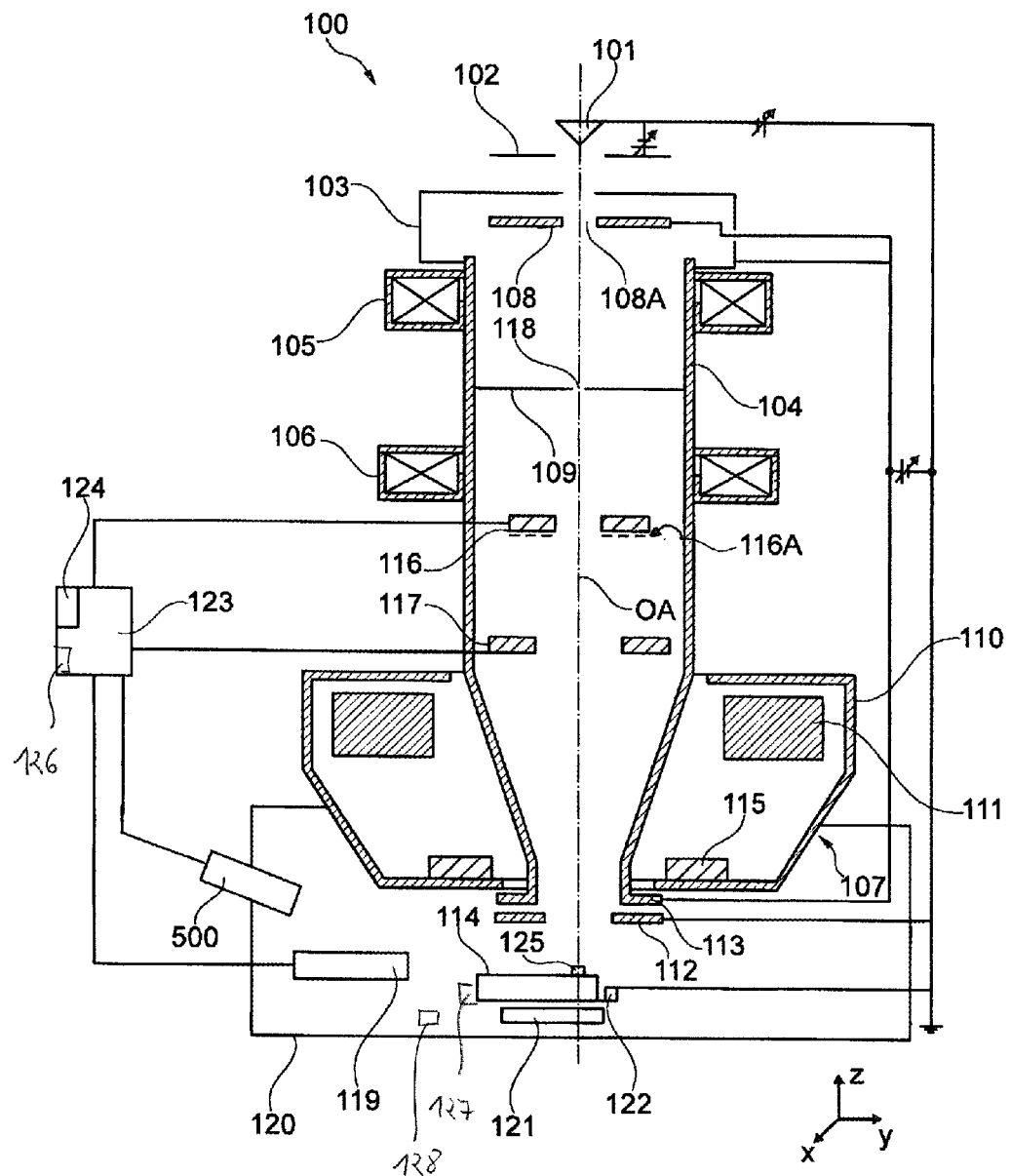
FIG. 1 shows a first embodiment of a particle beam apparatus.

FIG. 1 shows a schematic illustration of an SEM 100. The SEM 100 may comprise a first beam generator in the form of an electron source 101, which may be embodied as a cathode. Further, the SEM 100 may be provided with an extraction electrode 102 and with an anode 103, which may be placed onto one end of a beam guiding tube 104 of the SEM 100. By way of example, the electron source 101 is embodied as a thermal field emitter. However, the system described herein is not restricted to such an electron source 101. Rather, any electron source is utilizable.

Electrons emerging from the electron source 101 form a primary electron beam. The electrons may be accelerated to the anode potential on account of a potential difference between the electron source 101 and the anode 103. In the embodiment illustrated here, the anode potential may be 100 V to 35 kV, e.g. 5 kV to 15 kV, in particular 8 kV, relative to a ground potential of a housing of a sample chamber 120. However, alternatively it also may be at ground potential.

Two condenser lenses, specifically a first condenser lens 105 and a second condenser lens 106, may be arranged on the beam guiding tube 104. Here, proceeding from the electron source 101 as viewed in the direction of a first objective lens 107, the first condenser lens 105 is arranged first, followed by the second condenser lens 106. Reference is explicitly made to the fact that further embodiments of the SEM 100 may have only a single condenser lens. A first aperture unit 108 may be arranged between the anode 103 and the first condenser lens 105. Together with the anode 103 and the beam guiding tube 104, the first aperture unit 108 may be at a high voltage potential, specifically the potential of the anode 103, or connected to ground. The first aperture unit 108 may have numerous first apertures 108A, of which one is illustrated in FIG. 1. By way of example, two first apertures 108A are present. Each one of the numerous first apertures 108A may have a different aperture diameter. By means of an adjustment mechanism (not illustrated), it is possible to set a desired first aperture 108A onto an optical axis OA of the SEM 100. Reference is explicitly made to the fact that, in further embodiments, the first aperture unit 108 may be provided with only a single first aperture 108A. In this embodiment, an adjustment mechanism may be absent. The first aperture unit 108 then may be designed to be stationary. A stationary second aperture unit 109 may be arranged between the first condenser lens 105 and the second condenser lens 106. As an alternative thereto, provision is made for the second aperture unit 109 to be embodied in a movable fashion.

The first objective lens 107 may have pole pieces 110, in which a hole may be formed. The beam guiding tube 104 may be guided through this hole. A coil 111 may be arranged in the pole pieces 110.

An electrostatic retardation device may be arranged in a lower region of the beam guiding tube 104. This may comprise an individual electrode 112 and a tube electrode 113. The tube electrode 113 may be arranged at one end of the beam guiding tube 104, said end facing an object 125 that may be arranged on an object holder 114. The object holder 114 is explained in more detail below. Together with the beam guiding tube 104, the tube electrode 113 may be at the potential of the anode 103, while the individual electrode 112 and the object 125 may be at a lower potential in relation to the potential of the anode 103. In the present case, this may be the ground potential of the housing of the sample chamber 120. In this manner, the electrons of the primary electron beam may be decelerated to a desired energy which is required for examining the object 125.

The SEM 100 further may comprise a scanning device 115, by means of which the primary electron beam may be deflected and scanned over the object 125. Here, the electrons of the primary electron beam interact with the object 125. As a result of the interaction, interaction particles arise, which may be detected. In particular, electrons may be emitted from the surface of the object 125—so-called secondary electrons—or electrons of the primary electron beam may be backscattered—so-called backscattered electrons—as interaction particles.

The object 125 and the individual electrode 112 also may be at different potentials and potentials different than ground. It is thereby possible to set the location of the retardation of the primary electron beam in relation to the object 125. By way of example, if the retardation is carried out quite close to the object 125, imaging aberrations may become smaller.

A detector arrangement comprising a first detector 116 and a second detector 117 may be arranged in the beam guiding tube 104 for detecting the secondary electrons and/or the backscattered electrons. Here, the first detector 116 may be arranged on the source-side along the optical axis OA, while the second detector 117 may be arranged on the object-side along the optical axis OA in the beam guiding tube 104. The first detector 116 and the second detector 117 may be arranged offset from one another in the direction of the optical axis OA of the SEM 100. Both the first detector 116 and the second detector 117 may have a respective passage opening, through which the primary electron beam may pass. The first detector 116 and the second detector 117 may be approximately at the potential of the anode 103 and of the beam guiding tube 104. The optical axis OA of the SEM 100 extends through the respective passage openings.

The second detector 117 serves principally for detecting secondary electrons. Upon emerging from the object 125, the secondary electrons initially may have a low kinetic energy and random directions of motion. By means of the strong extraction field emanating from the tube electrode 113, the secondary electrons may be accelerated in the direction of the first objective lens 107. The secondary electrons may enter the first objective lens 107 approximately parallel. The beam diameter of the beam of the secondary electrons remains small in the first objective lens 107 as well. The first objective lens 107 then may have a strong effect on the secondary electrons and generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that are backscattered at the object 125—that is to say backscattered electrons which may have a relatively high kinetic energy in comparison with the secondary electrons upon emerging from the object 125—may be detected by the second detector 117. The high kinetic energy and the angles of the backscattered electrons with respect to the optical axis OA upon emerging from the object 125 may have the effect that a beam waist, that is to say a beam region having a minimum diameter, of the backscattered electrons may lie in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with an opposing field grid 116A. The opposing field grid 116A may be arranged at the side of the first detector 116 directed toward the object 125. With respect to the potential of the beam guiding tube 104, the opposing field grid 116A may have a negative potential such that only backscattered electrons with a high energy pass through the opposing field grid 116A to the first detector 116. Additionally or alternatively, the second detector 117 has a further opposing field grid, which has an analogous embodiment to the aforementioned opposing field grid 116A of the first detector 116 and which has an analogous function.

Further, the SEM 100 may have in the sample chamber 120 a chamber detector 119, for example an Everhart-Thornley detector or an ion detector, which may have a detection surface that may be coated with metal and blocks light.

The detection signals generated by the first detector 116, the second detector 117 and the chamber detector 119 may be used to generate an image or images of the surface of the object 125.

Reference is explicitly made to the fact that the apertures of the first aperture unit 108 and of the second aperture unit 109, as well as the passage openings of the first detector 116 and of the second detector 117, are illustrated in exaggerated fashion. The passage openings of the first detector 116 and of the second detector 117 may have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 may be configured as a pinhole aperture unit in the embodiment illustrated here and may be provided with a second aperture 118 for the passage of the primary electron beam, which second aperture may have an extent in the range from 5 μm to 500 μm, e.g., 35 μm. As an alternative thereto, provision is made in a further embodiment for the second aperture unit 109 to be provided with a plurality of apertures, which may be displaced mechanically with respect to the primary electron beam or which may be reached by the primary electron beam by the use of electrical and/or magnetic deflection elements. The second aperture unit 109 may be embodied as a pressure stage aperture unit. This separates a first region, in which the electron source 101 may be arranged and in which an ultra-high vacuum ($10^{-7}$ hPa to $10^{-12}$ hPa) prevails, from a second region, which may have a high vacuum ($10^{-3}$ hPa to $10^{-7}$ hPa). The second region may be the intermediate pressure region of the beam guiding tube 104, which leads to the sample chamber 120.

The sample chamber 120 may be under vacuum. For the purposes of producing the vacuum, a pump (not illustrated) may be arranged at the sample chamber 120. In the embodiment illustrated in FIG. 1, the sample chamber 120 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 120 may be vacuum-sealed.

The object holder 114 may be arranged on an object receiving device in the form of an object stage 122. The object stage 122 may be embodied to be movable in three directions arranged perpendicular to one another, specifically in an x-direction (first stage axis), in a y-direction (second stage axis), and in a z-direction (third stage axis). Moreover, the object stage 122 may be rotated about two rotation axes which may be disposed perpendicular to one another (stage rotation axes). The system described herein is not restricted to the object stage 122 described above. Rather, the object stage 122 may have further translation axes and rotation axes along which or about which the object stage 122 may move.

In a further embodiment of the SEM 100, provision is made for the object holder 114 to be embodied as an object receiving device, for example in the form of a manipulator and/or a gripper for holding the object 125. The object holder 114 then may have a movable embodiment, for example as explained above and further below in respect of the object stage 122.

The SEM 100 further may comprise a third detector 121, which may be arranged in the sample chamber 120. More precisely, the third detector 121 may be arranged downstream of the object holder 114, as viewed from the electron source 101 along the optical axis OA. The object holder 114 may be rotated in such a way that the object 125 that is arranged on the object holder 114 may have the primary electron beam radiated therethrough. When the primary electron beam passes through the object 125 to be examined, the electrons of the primary electron beam interact with the material of the object 125 to be examined. The electrons passing through the object 125 to be examined may be detected by the third detector 121.

Arranged at the sample chamber 120 may be a radiation detector 500, which may be used to detect interaction radiation, for example x-ray radiation and/or cathodoluminescence. The radiation detector 500, the first detector 116, the second detector 117, and the chamber detector 119 may be connected to a control unit 123, which may have a monitor 124. The third detector 121 also may be connected to the control unit 123. This is not illustrated for reasons of clarity. The control unit 123 processes detection signals that may be generated by the first detector 116, the second detector 117, the chamber detector 119, the third detector 121 and/or the radiation detector 500 and displays said detection signals in the form of images on the monitor 124.

The control unit 123 may comprise a database 126, in which the control unit 123 may store data and/or from which data may be loaded onto a processor of the control unit 123.

Arranged on the object holder 114 may be a cooling and/or heating device 127, which may be used to cool and/or heat the object holder 114 and/or the object 125. This is discussed in more detail further below.

A temperature measuring unit 128 may be arranged in the sample chamber 120 in order to determine a first temperature of the object 125, a third temperature of the object holder 114 and/or a second temperature of the object stage 122. By way of example, the temperature measuring unit 128 is embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the SEM 100 may comprise the processor or may be embodied as a processor. A computer program product that controls the SEM 100 in such a way that an embodiment of the method according to the system described herein is carried out may be loaded onto the processor. This is discussed in more detail further below.

Figure 2:
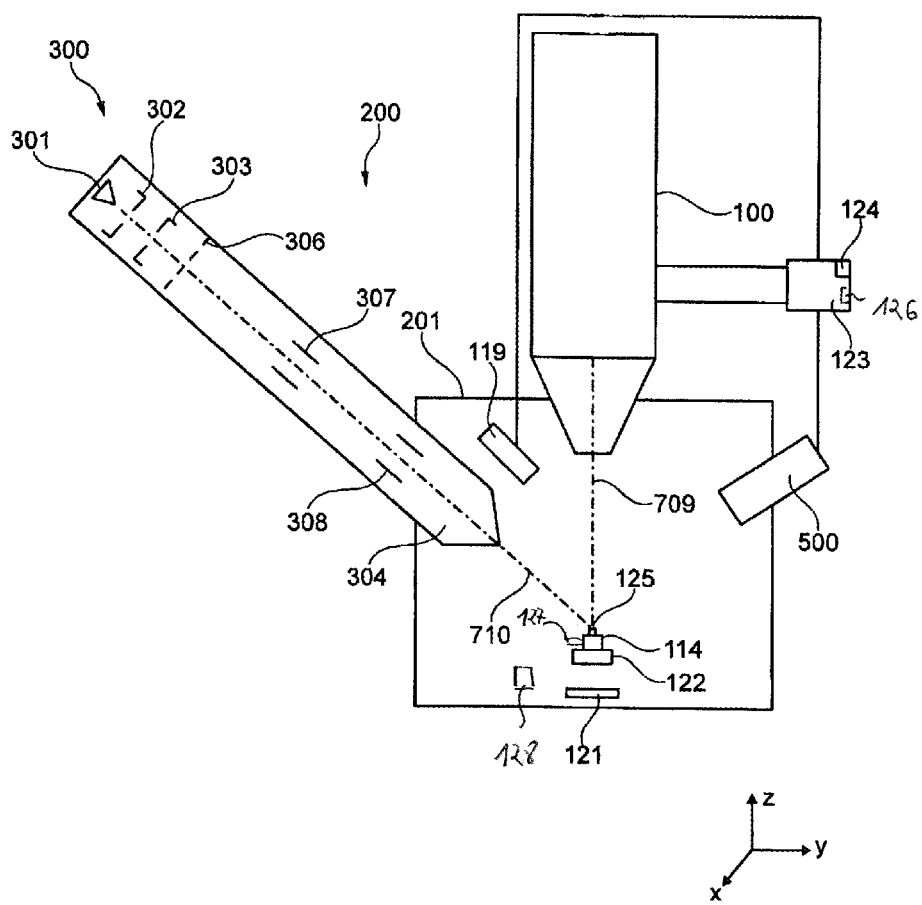
FIG. 2 shows a second embodiment of a particle beam apparatus.

FIG. 2 shows a particle beam apparatus in the form of a combination apparatus 200. The combination apparatus 200 may have two particle beam columns. Firstly, the combination apparatus 200 may be provided with the SEM 100, as already illustrated in FIG. 1, but without the sample chamber 120. Rather, the SEM 100 may be arranged at a sample chamber 201. The sample chamber 201 may be under vacuum. For the purposes of producing the vacuum, a pump (not illustrated) may be arranged at the sample chamber 201. In the embodiment illustrated in FIG. 2, the sample chamber 201 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 201 may be vacuum-sealed.

Arranged in the sample chamber 201 may be a chamber detector 119 which is embodied, for example, in the form of an Everhart-Thornley detector or an ion detector and which may have a detection surface that is coated with metal and blocks light. Further, the third detector 121 may be arranged in the sample chamber 201.

The SEM 100 serves to generate a first particle beam, specifically the primary electron beam already described further above, and may have the optical axis, already specified above, which is provided with the reference sign 709 in FIG. 2 and which is also referred to as first beam axis below. Secondly, the combination apparatus 200 may be provided with an ion beam apparatus 300, which may be likewise arranged at the sample chamber 201. The ion beam apparatus 300 likewise may have an optical axis, which may be provided with the reference sign 710 in FIG. 2 and which is also referred to as second beam axis below.

The SEM 100 may be arranged vertically in relation to the sample chamber 201. By contrast, the ion beam apparatus 300 may be arranged in a manner inclined by an angle of approximately 0° to 90° in relation to the SEM 100. An arrangement of approximately 50° is illustrated by way of example in FIG. 2. The ion beam apparatus 300 may comprise a second beam generator in the form of an ion beam generator 301. Ions, which form a second particle beam in the form of an ion beam, may be generated by the ion beam generator 301. The ions may be accelerated by means of an extraction electrode 302, which may be at a predeterminable potential. The second particle beam then passes through an ion optical unit of the ion beam apparatus 300, wherein the ion optical unit may comprise a condenser lens 303 and a second objective lens 304. The second objective lens 304 ultimately generates an ion probe, which may be focused onto the object 125 arranged at an object holder 114. The object holder 114 may be arranged on an object receiving device in the form of an object stage 122.

In a further embodiment of the combination apparatus 200, provision is made for the object holder 114 to be embodied as an object receiving device, for example in the form of a manipulator and/or a gripper for holding the object 125. The object holder 114 then may have a movable embodiment, for example as explained above and further below in respect of the object stage 122.

An adjustable or selectable aperture unit 306, a first electrode arrangement 307 and a second electrode arrangement 308 may be arranged above the second objective lens 304 (i.e., in the direction of the ion beam generator 301), wherein the first electrode arrangement 307 and the second electrode arrangement 308 may be embodied as scanning electrodes. The second particle beam may be scanned over the surface of the object 125 by means of the first electrode arrangement 307 and the second electrode arrangement 308, with the first electrode arrangement 307 acting in a first direction and the second electrode arrangement 308 acting in a second direction, which may be counter to the first direction. Thus, scanning may be carried out in an x-direction, for example. The scanning in a y-direction perpendicular thereto may be brought about by further electrodes (not illustrated), which may be rotated by 90°, at the first electrode arrangement 307 and at the second electrode arrangement 308.

As explained above, the object holder 114 may be arranged on the object stage 122. In the embodiment shown in FIG. 2, too, the object stage 122 may be embodied to be movable in three directions disposed perpendicular to one another, specifically in an x-direction (first stage axis), in a y-direction (second stage axis) and in a z-direction (third stage axis). Moreover, the object stage 122 may be rotated about two rotation axes which may be disposed perpendicular to one another (stage rotation axes).

The distances illustrated in FIG. 2 between the individual units of the combination apparatus 200 are illustrated in exaggerated fashion in order to better illustrate the individual units of the combination apparatus 200.

Arranged at the sample chamber 201 may be a radiation detector 500, which may be used to detect interaction radiation, for example x-ray radiation and/or cathodoluminescence. The radiation detector 500 may be connected to a control unit 123, which may have a monitor 124. The control unit 123 processes detection signals that may be generated by the first detector 116, the second detector 117 (not illustrated in FIG. 2), the chamber detector 119, the third detector 121 and/or the radiation detector 500 and displays said detection signals in the form of images on the monitor 124.

The control unit 123 may comprise a database 126, in which the control unit 123 may store data and/or from which data may be loaded onto a processor of the control unit 123.

Arranged on the object holder 114 may be a cooling and/or heating device 127, which may be used to cool and/or heat the object holder 114 and/or the object 125. This is discussed in more detail further below.

A temperature measuring unit 128 may be arranged in the sample chamber 201 in order to determine a first temperature of the object, a third temperature of the object holder 114 and/or a second temperature of the object stage 122. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the combination apparatus 200 may comprise the processor or may be embodied as a processor. A computer program product that controls the combination apparatus 200 in such a way that an embodiment of the method according to the system described herein is carried out may be loaded onto the processor. This is discussed in more detail further below.

Figure 3:
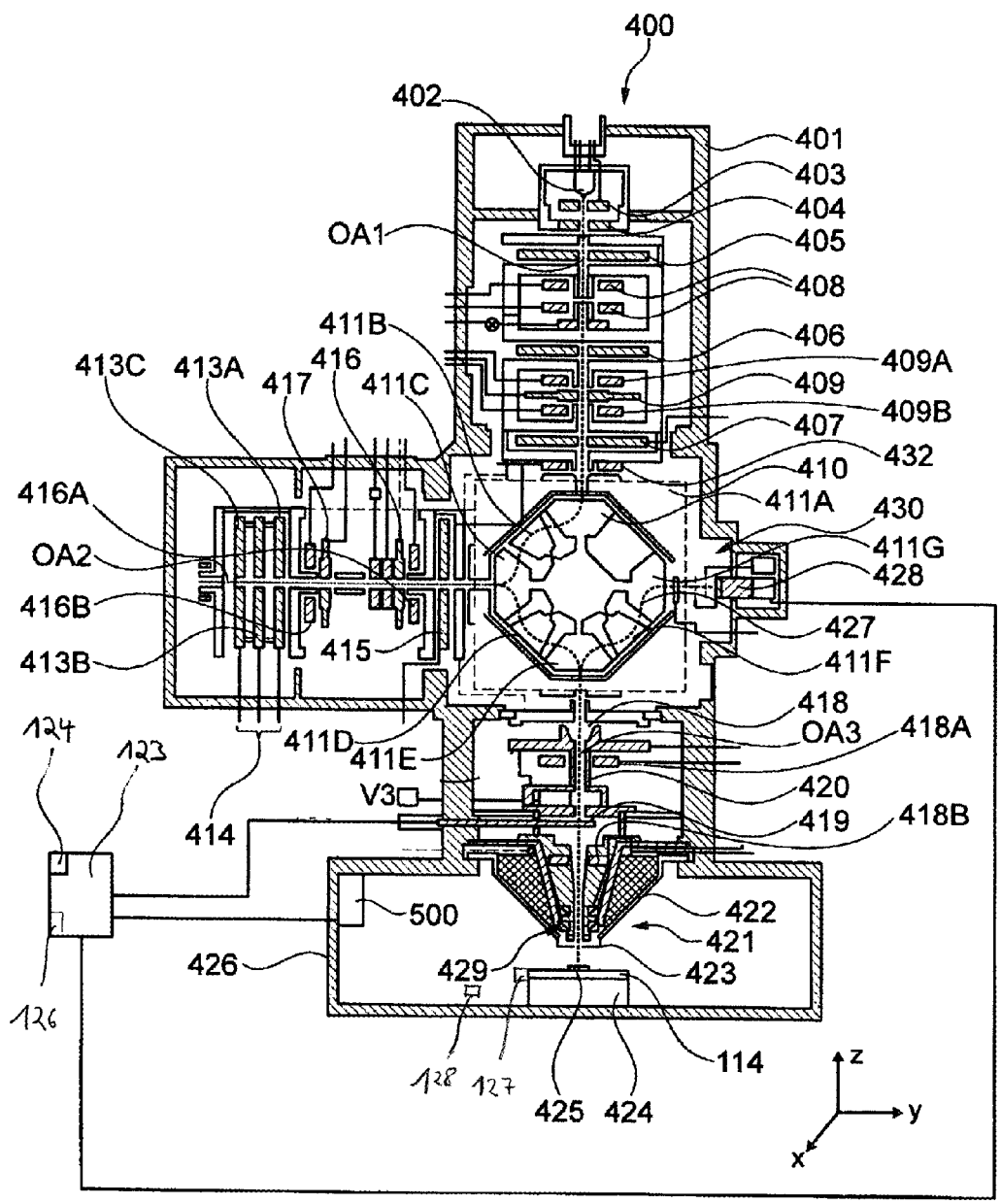
FIG. 3 shows a third embodiment of a particle beam apparatus.

FIG. 3 is a schematic illustration of a further embodiment of a particle beam apparatus according to an embodiment of the system described herein. This embodiment of the particle beam apparatus is provided with the reference sign 400 and may comprise a mirror corrector for correcting e.g. chromatic and/or spherical aberrations. The particle beam apparatus 400 may comprise a particle beam column 401, which may be embodied as an electron beam column and which substantially corresponds to an electron beam column of a corrected SEM. However, the particle beam apparatus 400 is not restricted to an SEM with a mirror corrector. Rather, the particle beam apparatus may comprise any type of corrector units.

The particle beam column 401 may comprise a particle beam generator in the form of an electron source 402 (cathode), an extraction electrode 403, and an anode 404. By way of example, the electron source 402 is embodied as a thermal field emitter. Electrons emerging from the electron source 402 may be accelerated to the anode 404 on account of a potential difference between the electron source 402 and the anode 404. Accordingly, a particle beam in the form of an electron beam may be formed along a first optical axis OA1.

The particle beam may be guided along a beam path, which corresponds to the first optical axis OA1, after the particle beam has emerged from the electron source 402. A first electrostatic lens 405, a second electrostatic lens 406, and a third electrostatic lens 407 may be used to guide the particle beam.

Furthermore, the particle beam may be set along the beam path using a beam guiding device. The beam guiding device of this embodiment may comprise a source setting unit with two magnetic deflection units 408 arranged along the first optical axis OA1. Moreover, the particle beam apparatus 400 may comprise electrostatic beam deflection units. A first electrostatic beam deflection unit 409, which also may be embodied as a quadrupole in a further embodiment, may be arranged between the second electrostatic lens 406 and the third electrostatic lens 407. The first electrostatic beam deflection unit 409 may be likewise arranged downstream of the magnetic deflection units 408. A first multi-pole unit 409A in the form of a first magnetic deflection unit may be arranged at one side of the first electrostatic beam deflection unit 409. Moreover, a second multi-pole unit 409B in the form of a second magnetic deflection unit may be arranged at the other side of the first electrostatic beam deflection unit 409. The first electrostatic beam deflection unit 409, the first multipole unit 409A, and the second multi-pole unit 409B may be set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 may be arranged at the entrance to the beam deflection device 410.

The beam deflection device 410 may be used as a particle beam deflector, which deflects the particle beam in a specific manner. The beam deflection device 410 may comprise a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam may enter the beam deflection device 410 along the first optical axis OA1 and said particle beam may be deflected by the beam deflection device 410 in the direction of a second optical axis OA2. The beam deflection may be performed by means of the first magnetic sector 411A, by means of the second magnetic sector 411B, and by means of the third magnetic sector 411C through an angle of 30° to 120°. The second optical axis OA2 may be oriented at the same angle with respect to the first optical axis OA1. The beam deflection device 410 also deflects the particle beam which may be guided along the second optical axis OA2, to be precise in the direction of a third optical axis OA3. The beam deflection may be provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 may be provided by deflection of the particle beam at an angle of 90°. Hence, the third optical axis OA3 extends coaxially with respect to the first optical axis OA1. However, reference is made to the fact that the particle beam apparatus 400 according to the system described herein is not restricted to deflection angles of 90°. Rather, any suitable deflection angle may be selected by the beam deflection device 410, for example 70° or 110°, such that the first optical axis OA1 does not extend coaxially with respect to the third optical axis OA3. In respect of further details of the beam deflection device 410, reference is made to WO 2002/067286 A2.

After the particle beam has been deflected by the first magnetic sector 411A, the second magnetic sector 411B, and the third magnetic sector 411C, the particle beam may be guided along the second optical axis OA2. The particle beam may be guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the particle beam which may be reflected back at the electrostatic mirror 414 once again travel along the second optical axis OA2 and may re-enter the beam deflection device 410. Then, they may be deflected to the third optical axis OA3 by the third magnetic sector 411C, the fourth magnetic sector 411D, and the fifth magnetic sector 411E.

The electrons of the particle beam emerge from the beam deflection device 410 and said electrons may be guided along the third optical axis OA3 to an object 425 that is intended to be examined and arranged on an object holder 114. On the path to the object 425, the particle beam may be guided to a fifth electrostatic lens 418, a beam guiding tube 420, a fifth multi-pole unit 418A, a sixth multi-pole unit 418B, and an objective lens 421. The fifth electrostatic lens 418 may be an electrostatic immersion lens. By way of the fifth electrostatic lens 418, the particle beam may be decelerated or accelerated to an electric potential of the beam guiding tube 420.

By means of the objective lens 421, the particle beam may be focused into a focal plane in which the object 425 is arranged. The object holder 114 may be arranged on an object receiving device in the form of a movable object stage 424. The movable object stage 424 may be arranged in a sample chamber 426 of the particle beam apparatus 400. The object stage 424 may be embodied to be movable in three directions arranged perpendicular to one another, specifically in an x-direction (first stage axis), in a y-direction (second stage axis), and in a z-direction (third stage axis). Moreover, the object stage 424 may be rotated about two rotation axes which may be disposed perpendicular to one another (stage rotation axes).

In a further embodiment of the particle beam apparatus 400, provision is made for the object holder 114 to be embodied as an object receiving device, for example in the form of a manipulator and/or a gripper for holding the object 425. The object holder 114 then may have a movable embodiment, for example as explained above and further below in respect of the object stage 424.

The sample chamber 426 may be under vacuum. For the purposes of producing the vacuum, a pump (not illustrated) may be arranged at the sample chamber 426. In the embodiment illustrated in FIG. 3, the sample chamber 426 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 426 may be vacuum-sealed.

The objective lens 421 may be embodied as a combination of a magnetic lens 422 and a sixth electrostatic lens 423. The end of the beam guiding tube 420 further may be an electrode of an electrostatic lens. After emerging from the beam guiding tube 420, particles of the particle beam apparatus may be decelerated to a potential of the object 425. The objective lens 421 is not restricted to a combination of the magnetic lens 422 and the sixth electrostatic lens 423. Rather, the objective lens 421 may assume any suitable form. By way of example, the objective lens 421 also may be embodied as a purely magnetic lens or as a purely electrostatic lens.

The particle beam which may be focused onto the object 425 interacts with the object 425. Interaction particles may be generated. In particular, secondary electrons may be emitted from the object 425 or backscattered electrons may be backscattered at the object 425. The secondary electrons or the backscattered electrons may be accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 may comprise a first analysis detector 419, which may be arranged between the beam deflection device 410 and the objective lens 421 along the beam path. Secondary electrons traveling in directions oriented at a large angle with respect to the third optical axis OA3 may be detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—may enter the beam deflection device 410 and may be deflected to a second analysis detector 428 by the fifth magnetic sector 411E, the sixth magnetic sector 411F, and the seventh magnetic sector 411G along a detection beam path 427. By way of example, the deflection angle is 90° or 110°.

The first analysis detector 419 generates detection signals which are largely generated by emitted secondary electrons. The detection signals which are generated by the first analysis detector 419 may be guided to a control unit 123 and may be used to obtain information about the properties of the interaction region of the focused particle beam with the object 425. In particular, the focused particle beam may be scanned over the object 425 using a scanning device 429. By means of the detection signals generated by the first analysis detector 419, an image of the scanned region of the object 425 then may be generated and displayed on a display unit. The display unit is for example a monitor 124 that may be arranged at the control unit 123.

The second analysis detector 428 also may be connected to the control unit 123. Detection signals of the second analysis detector 428 may be passed to the control unit 123 and used to generate an image of the scanned region of the object 425 and to display it on a display unit. The display unit is for example the monitor 124 that may be arranged at the control unit 123.

Arranged at the sample chamber 426 may be a radiation detector 500, which may be used to detect interaction radiation, for example x-ray radiation and/or cathodoluminescence. The radiation detector 500 may be connected to the control unit 123, which may have the monitor 124. The control unit 123 processes detection signals of the radiation detector 500 and displays them in the form of images on the monitor 124.

The control unit 123 may comprise a database 126, in which the control unit 123 may store data and/or from which data may be loaded onto a processor of the control unit 123. Arranged on the object holder 114 may be a cooling and/or heating device 127, which may be used to cool and/or heat the object holder 114 and/or the object 425. This is discussed in more detail further below.

A temperature measuring unit 128 may be arranged in the sample chamber 426 in order to determine a first temperature of the object 425, a third temperature of the object holder 114 and/or a second temperature of the object stage 424. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the particle beam apparatus 400 may comprise the processor or may be embodied as a processor. A computer program product that controls the particle beam apparatus 400 in such a way that an embodiment of the method according to the system described herein is carried out may be loaded onto the processor. This is discussed in more detail further below.

Figure 3A:
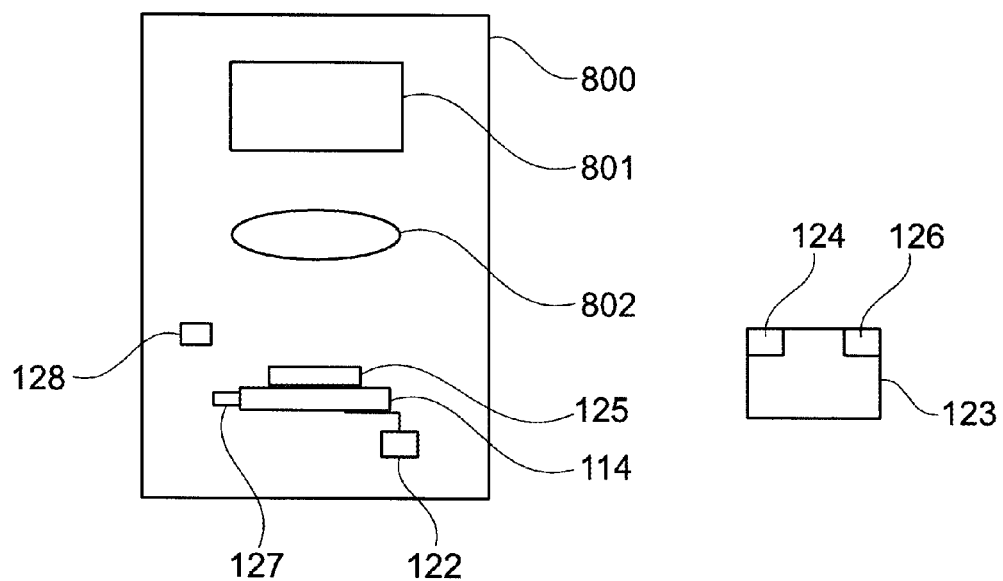
FIG. 3A shows a schematic illustration of a light microscope, according to an embodiment of the system described herein.

FIG. 3A shows a schematic illustration of a light microscope 800. The light microscope 800 may comprise a light source 801 for generating light and an optical unit 802 for guiding the light to the object 125. Further, the light microscope 800 may be provided with an object holder 114 for holding the object 125. Moreover, the light microscope 800 may be embodied with a movably embodied object stage 122, on which the object holder 114 may be arranged.

The object stage 122 of the light microscope 800 may be embodied to be movable along a first translation axis (in particular an x-axis), along a second translation axis (in particular a y-axis), and along a third translation axis (in particular a z-axis), for example. By way of example, the first translation axis, the second translation axis, and the third translation axis may be oriented perpendicular to one another. Further, the object stage 122 is for example embodied to be rotatable about a first axis of rotation and about a second axis of rotation, which may be aligned perpendicular to the first axis of rotation. In one embodiment of the light microscope 800, a respective motor is provided for each of the aforementioned axes, said motor facilitating the movement along the corresponding axis.

In a further embodiment of the light microscope 800, provision is made for the object holder 114 to be embodied as an object receiving device, for example in the form of a manipulator and/or a gripper for holding the object 125. The object holder 114 then may have a movable embodiment, for example as explained above and further below in respect of the object stage 122.

The light microscope 800 may comprise a control unit 123 provided with a monitor 124, on which images of the object 125 recorded by the light microscope 800 may be displayable.

The control unit 123 may comprise a database 126, in which the control unit 123 may store data and/or from which data may be loaded onto a processor of the control unit 123.

Arranged on the object holder 114 may be a cooling and/or heating device 127, which may be used to cool and/or heat the object holder 114 and/or the object 125. This is discussed in more detail further below.

The light microscope 800 may comprise a temperature measuring unit 128 in order to determine a first temperature of the object, a third temperature of the object holder 114 and/or a second temperature of the object stage 122. By way of example, the temperature measuring unit 128 is embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the light microscope 800 may comprise the processor or may be embodied as a processor. A computer program product that controls the light microscope 800 in such a way that an embodiment of the method according to the system described herein is carried out may be loaded onto the processor. This is discussed in more detail further below.

Figure 4:
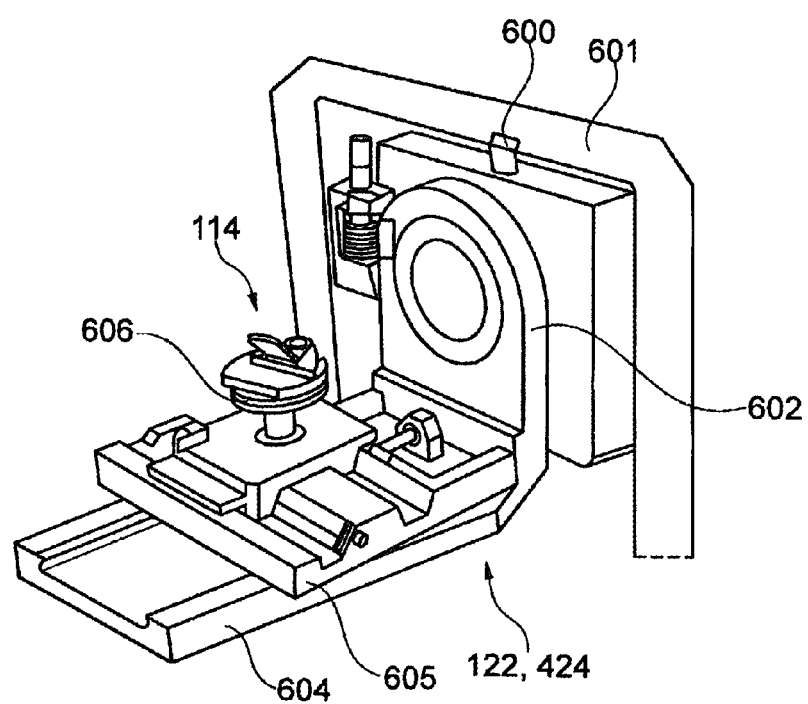
FIG. 4 shows a schematic illustration of an embodiment of a movably embodied object stage for a particle beam apparatus and/or a light microscope, according to an embodiment of the system described herein.

The object stage 122, 424 of the particle beam apparatuses 100, 200, and 400 explained above and of the light microscope 800 is now discussed in more detail below. The object stage 122, 424 may be embodied as a movable object stage, which is illustrated schematically in FIGS. 4 and 5. Reference is made to the fact that the system described herein is not restricted to the object stage 122, 424 described here. Rather, the system described herein may include any movable object stage that is suitable for the system described herein.

Arranged on the object stage 122, 424 may be the object holder 114, in which the object 125, 425 may be arranged in turn. The object stage 122, 424 may have movement elements that may ensure a movement of the object stage 122, 424 in such a way that a region of interest on the object 125, 425 may be examined by means of a particle beam and/or a light beam. The movement elements are illustrated schematically in FIGS. 4 and 5 and are explained below.

The object stage 122, 424 may comprise a first movement element 600, which may be arranged, for example, on a housing 601 of the sample chamber 120, 201 or 426, in which the object stage 122, 424 may be arranged in turn. The first movement element 600 enables a movement of the object stage 122, 424 along the z-axis (third stage axis). Further, provision is made of a second movement element 602. The second movement element 602 enables a rotation of the object stage 122, 424 about a first stage rotation axis 603, which is also referred to as a tilt axis. This second movement element 602 serves to tilt an object 125, 425 arranged in the object holder 114 about the first stage rotation axis 603.

Arranged at the second movement element 602, in turn, may be a third movement element 604 that may be embodied as a guide for a slide and that may ensure that the object stage 122, 424 is movable in the x-direction (first stage axis). The aforementioned slide may be a further movement element in turn, namely a fourth movement element 605. The fourth movement element 605 may be embodied in such a way that the object stage 122, 424 is movable in the y-direction (second stage axis). To this end, the fourth movement element 605 may have a guide in which a further slide may be guided, the object holder 114 in turn being arranged at the latter.

The object holder 114 may be embodied, in turn, with a fifth movement element 606, which enables a rotation of the object holder 114 about a second stage rotation axis 607. The second stage rotation axis 607 may be oriented perpendicular to the first stage rotation axis 603.

On account of the above-described arrangement, the object stage 122, 424 of the embodiment discussed here may have the following kinematic chain: first movement element 600 (movement along the z-axis)-second movement element 602 (rotation about the first stage rotation axis 603)-third movement element 604 (movement along the x-axis)-fourth movement element 605 (movement along the y-axis)-fifth movement element 606 (rotation about the second stage rotation axis 607).

In a further embodiment (not illustrated), provision is made for further movement elements to be arranged at the object stage 122, 424 such that movements along further translational axes and/or about further rotation axes are made possible.

Figure 5:
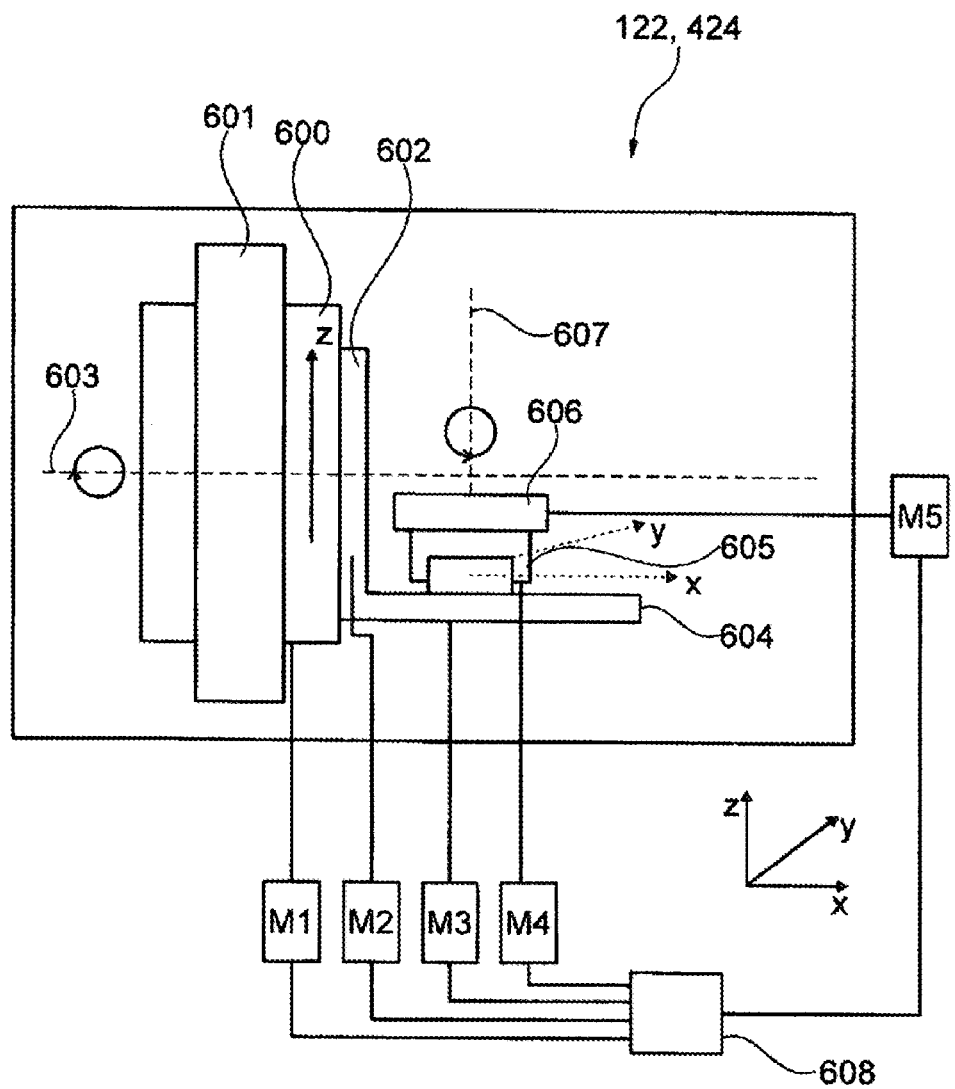
FIG. 5 shows a further schematic illustration of the object stage according to FIG. 4, according to an embodiment of the system described herein.

It is clear from FIG. 5 that each of the aforementioned movement elements may be connected to a drive unit in the form of a motor M1 to M5. Thus, the first movement element 600 may be connected to a first drive unit M1 and may be driven on account of a driving force that is provided by the first drive unit M1. The second movement element 602 may be connected to a second drive unit M2, which drives the second movement element 602. The third movement element 604 may be connected, in turn, to a third drive unit M3. The third drive unit M3 provides a driving force for driving the third movement element 604. The fourth movement element 605 may be connected to a fourth drive unit M4, wherein the fourth drive unit M4 drives the fourth movement element 605. Furthermore, the fifth movement element 606 may be connected to a fifth drive unit M5. The fifth drive unit M5 provides a driving force that drives the fifth movement element 606.

The aforementioned drive units M1 to M5 may be embodied as stepper motors, for example, and may be controlled by a control unit 608 and may be each supplied with a supply current by the control unit 608 (cf. FIG. 5). It is explicitly pointed out that the system described herein is not restricted to the movement by means of stepper motors. Rather, any drive units may be used as drive units, for example brushless motors. By feeding the supply current to the drive units M1 to M5, the drive units M1 to M5 may be controlled in such a way that the object stage 122, 424 may be moved to a desired position in the sample chamber 120, 201, 426. The object stage 122, 424 may be held in this desired position by means of the drive units M1 to M5. Expressed differently, the object stage 122, 424 should no longer move away from this desired position. This may be desirable, in particular, for a good resolution and/or an accurate image representation of an object 125, 425 arranged on the object stage 122, 424. When the drive units M1 to M5 are stopped, the amplitude of the supply current may be lowered to a specifiable holding amplitude for each of the drive units M1 to M5. The supply current with this holding amplitude is also referred to as a holding current. When the supply current is at the holding current for each of the drive units M1 to M5, the object stage 122, 424 remains at the desired position.

Below, embodiments of the method according to the system described herein are explained in more detail, using the SEM 100 as an example. Corresponding statements apply in respect of the combination apparatus 200, the particle beam apparatus 400, and the light microscope 800.

Figure 6:
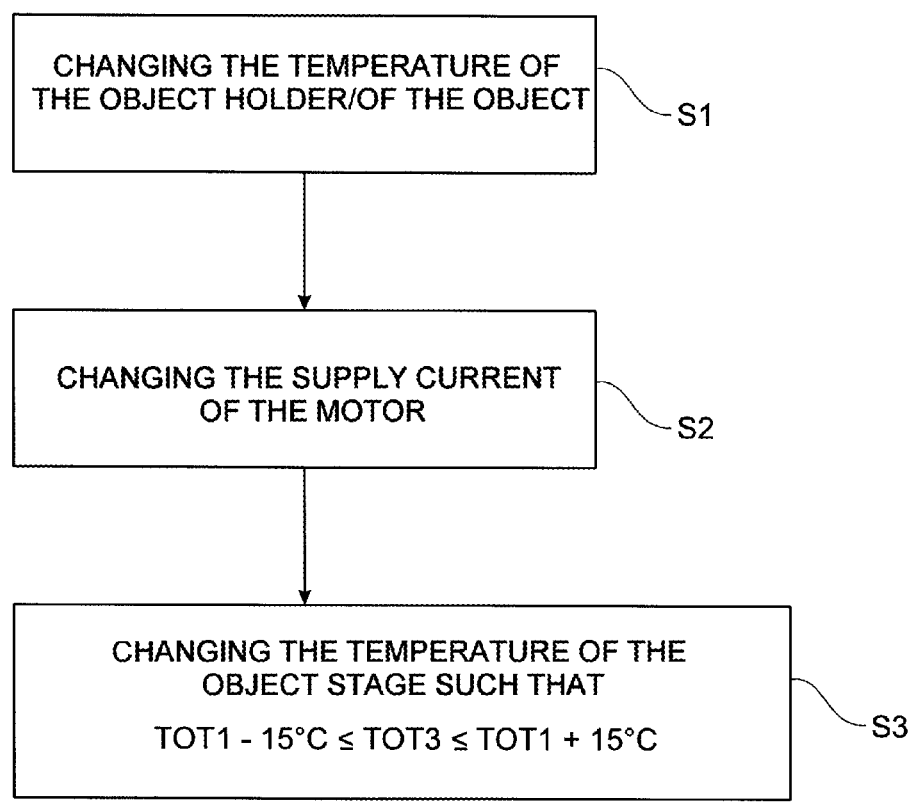
FIG. 6 shows a schematic illustration of a flowchart of a first embodiment of the method according to the system described herein.

FIG. 6 shows a schematic illustration of a flowchart of one embodiment of the method according to the system described herein. In method step S1, a third temperature of the object holder 114, on which the object 125 may be arranged, may be changed from a first temperature value of the object holder 114 to a second temperature value of the object holder 114 by means of the cooling and/or heating device 127. By way of example, the object holder 114 is cooled and/or heated from the first temperature value of the object holder 114 to the second temperature value of the object holder 114. In addition or as an alternative thereto, a first temperature of the object 125 is changed from a first temperature value of the object 125 to a second temperature value of the object 125 by means of the cooling and/or heating device 127. By way of example, the object 125 is cooled and/or heated from the first temperature value of the object 125 to the second temperature value of the object 125.

The changing of the third temperature of the object holder 114 and/or the first temperature of the object 125 may bring about a change in a second temperature of the object stage 122 from a first temperature value of the object stage 122 to a second temperature value of the object stage 122. Expressed differently, a change in the third temperature of the object holder 114 and/or of the first temperature of the object 125 also may bring about a change in the second temperature of the object stage 122.

In method step S2, the supply current of the drive units M1 to M5 may be changed from a first current value to a second current value. The object stage 122 may be held at the desired position in the sample chamber 120 by the drive units M1 to M5 in the case of both the first current value and the second current value of the supply current. Consequently, the aforementioned supply current may be a holding current. Expressed differently, the object stage 122 may be held at the desired position in the sample chamber 120 by the drive units M1 to M5 when the supply current may have the first current value or the second current value.

Now, the first temperature of the object stage 122 may be changed in method step S3. In more detail, the second temperature of the object stage 122 may be changed from the second temperature value of the object stage 122 to a third temperature value of the object stage 122 on account of heat generated by the drive units M1 to M5, said heat being obtained by the second current value of the supply current and being fed to the object stage 122. The third temperature value of the object stage 122 may lie in a temperature range, to which the following applies:

$$TOT1-15°\ C.\leq TOT3\leq TOT1+15°\ C.,\quad\quad [1]$$

where
TOT1 is the first temperature value of the object stage 122, and where
TOT3 is the third temperature value of the object stage 122.

Expressed differently, the third temperature value of the object stage 122 may lie in a range of ±15° C. around the first temperature value of the object stage 122.

In one embodiment of the method according to the system described herein, method steps S1 to S3 are repeated.

Figure 7:
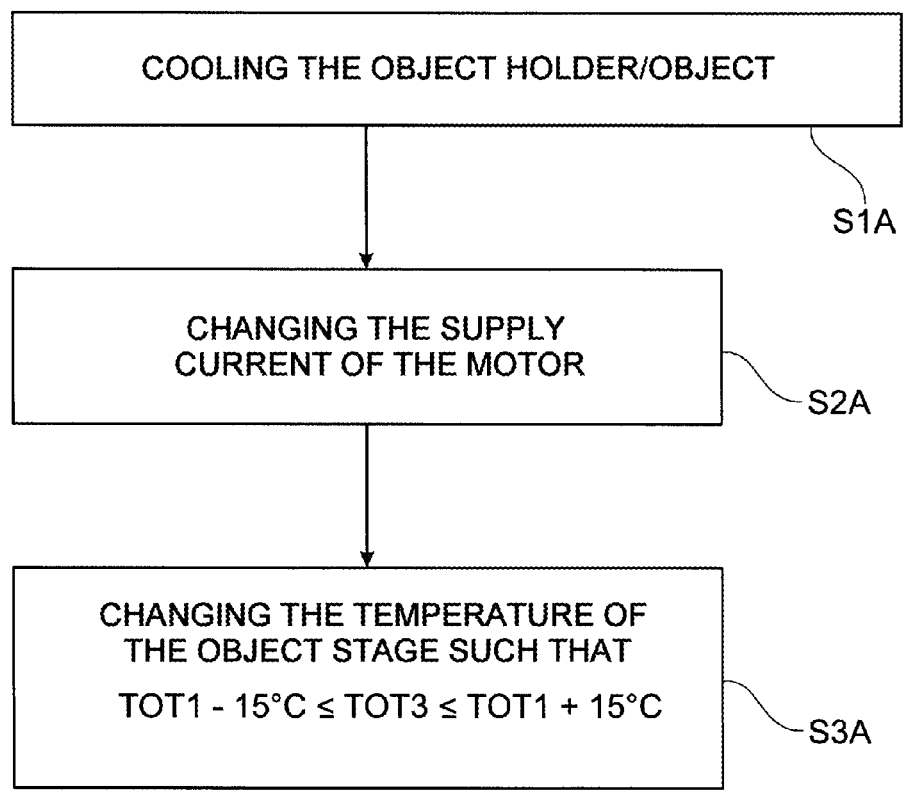
FIG. 7 shows a schematic illustration of a flowchart of a second embodiment of the method according to the system described herein.

FIG. 7 shows a schematic illustration of a flowchart of a further embodiment of the method according to the system described herein. The embodiment of FIG. 7 is based on the embodiment of FIG. 6. Therefore, reference is initially made to the explanations provided above, which also apply in this case. The embodiment of FIG. 7 provides for cooling of the object holder 114 in method step S1A. Accordingly, in method step S1A, the third temperature of the object holder 114, on which the object 125 may be arranged, may be lowered from the first temperature value of the object holder 114 to the second temperature value of the object holder 114 by means of the cooling and/or heating device 127. Accordingly, the first temperature value of the object holder 114 may be greater than the second temperature value of the object holder 114. By way of example, liquid nitrogen or liquid helium is used for cooling purposes. By way of example, the first temperature value of the object holder 114 is the value of room temperature. By way of example, the second temperature value of the object holder 114 is less than or equal to −140° C. In addition or as an alternative thereto, the embodiment of FIG. 7 provides for a cooling of the object 125 in a method step S1A. Accordingly, in method step S1A, the first temperature of the object 125 may be lowered from a first temperature value of the object 125 to a second temperature value of the object 125 by means of the cooling and/or heating device 127. Accordingly, the first temperature value of the object 125 may be greater than the second temperature value of the object 125. By way of example, liquid nitrogen or liquid helium is used for cooling purposes. By way of example, the first temperature value of the object 125 is the value of room temperature. By way of example, the second temperature value of the object 125 is less than or equal to −140° C.

The changing of the first temperature of the object 125 and/or the third temperature of the object holder 114 may bring about a change in the second temperature of the object stage 122 from the first temperature value of the object stage 122 to the second temperature value of the object stage 122. Expressed differently, a change in the first temperature of the object 125 and/or of the third temperature of the object stage 114 also may bring about a change in the second temperature of the object stage 122. In the present case, the first temperature value of the object stage 122 may be greater than the second temperature value of the object stage 122. By way of example, the first temperature value of the object stage 122 is room temperature and the second temperature value of the object stage 122 is a value of approximately 5° C. to 15° C. below room temperature.

In method step S2A, the supply current of the drive units M1 to M5 may be changed from the first current value to the second current value. In the embodiment of the method according to the system described herein illustrated in FIG. 7, the supply current of the drive units M1 to M5 may be changed in such a way that the following applies: I2>I1, where I1 is the first current value of the supply current and where I2 is the second current value of the supply current. Expressed differently, the supply current of the drive units M1 to M5 for holding the object stage 122 by means of the drive units M1 to M5 in the sample chamber 120 may be changed in such a way that the second current value of the supply current is greater than the first current value of the supply current. As a result of this, the drive units M1 to M5 generate more heat, which may be fed to the object stage 122.

Now, the first temperature of the object stage 122 may be changed in method step S3A. In more detail, the second temperature of the object stage 122 may be changed from the second temperature value of the object stage 122 to the third temperature value of the object stage 122 on account of the heat generated in the drive units M1 to M5, said heat being obtained by the second current value of the supply current and being fed to the object stage 122. The third temperature value of the object stage 122 may lie in the aforementioned temperature range.

In the embodiment of the method according to the system described herein illustrated in FIG. 7, provision is made, in particular, for the supply current to be changed in such a way that the following applies: TOT1>TOT2 and TOT2<TOT3, where TOT2 is the second temperature value of the object stage 122. Expressed differently, the supply current may be changed in such a way that two conditions are satisfied. Firstly, the first temperature value of the object stage 122 may be greater than the second temperature value of the object stage 122. Secondly, the second temperature value of the object stage 122 may be less than the third temperature value of the object stage 122.

In yet a further embodiment of the method according to the system described herein as per FIG. 7, provision is additionally or alternatively made for the changing of the second temperature of the object stage 122 from the second temperature value of the object stage 122 to the third temperature value of the object stage 122 to be implemented in such a way that the third temperature value of the object stage 122 corresponds to the first temperature value of the object stage 122. Expressed differently, a change in the second temperature of the object stage 122 may be counteracted by the heat generated by the drive units M1 to M5 in such a way that the second temperature of the object stage 122 re-adopts the original temperature value or substantially the original temperature value before the first temperature of the object holder 114 was changed, the original temperature value corresponding to the first temperature value of the object stage 122. In this embodiment of the method according to the system described herein, a drift of the object stage 122 that occurred before the change in the first temperature of the object 125 and/or in the third temperature of the object holder 114 may be substantially obtained.

In a further embodiment of the method according to the system described herein as per FIG. 7, provision is made for the change of the second temperature of the object stage 122 from the second temperature value to the third temperature value to be implemented such that the following applies: TOT1−15° C.≤TOT3≤TOT1. Expressed differently, the third temperature value of the object stage 122 may lie in a range which may be bounded by a temperature 15° C. below the first temperature value of the object stage 122 and by the first temperature value of the object stage 122 itself. The range boundaries are included in the range in this case.

Figure 8:
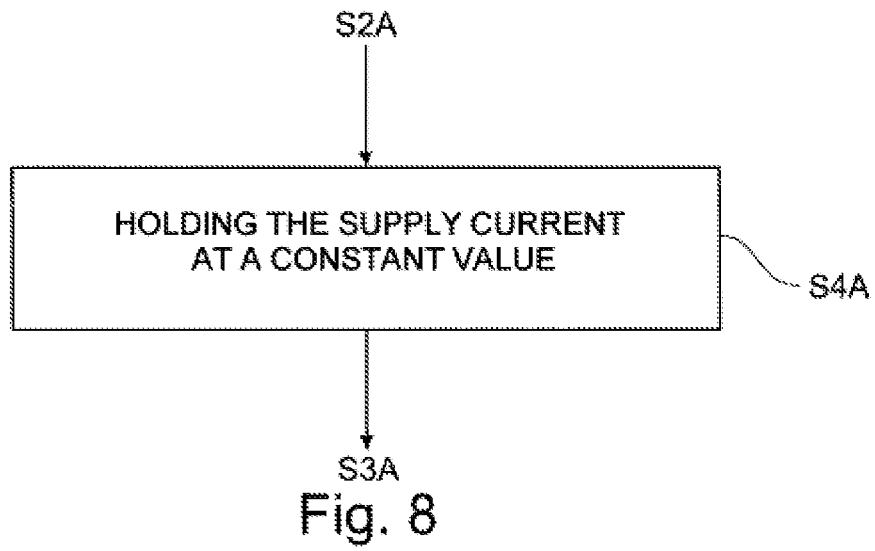
FIG. 8 shows a schematic illustration of a flowchart of a third embodiment of the method according to the system described herein.

FIG. 8 shows yet another embodiment of the method according to the system described herein, which is based on the embodiment of FIG. 7. Therefore, reference is initially made to the observations provided above, which also apply in this case. In contrast to the embodiment of FIG. 7, the embodiment of FIG. 8 includes a method step S4A being carried out, the latter being carried out between method steps S2A and S3A, for example. The supply current may be changed in such a way that the following applies: I2>I1, where I1 is the first current value of the supply current and where I2 is the second current value of the supply current. Once the second current value of the supply current has been reached, the supply current may be held constant at the second current value.

Figure 9:
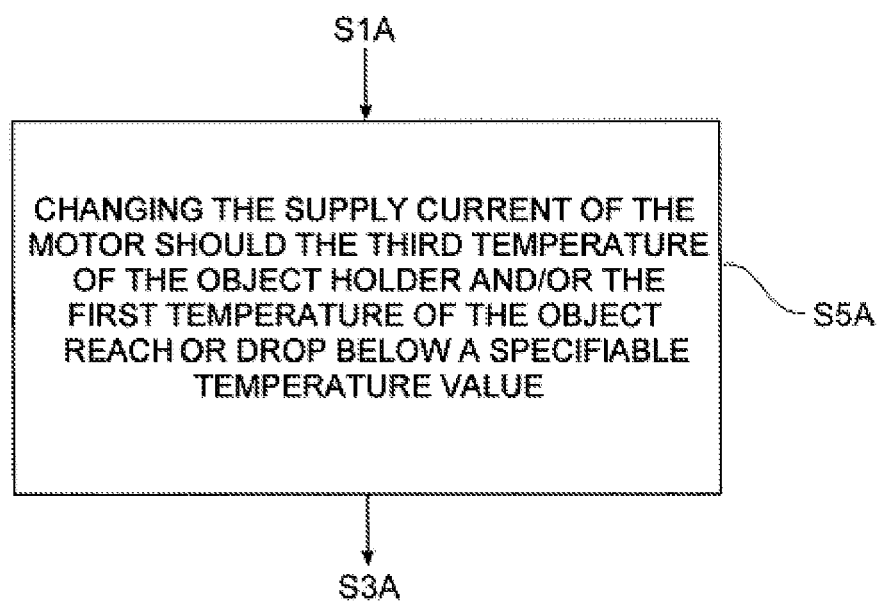
FIG. 9 shows a schematic illustration of a flowchart of a fourth embodiment of the method according to the system described herein.

FIG. 9 shows yet another embodiment of the method according to the system described herein, which is based on the embodiment of FIG. 7. Therefore, reference is initially made to the observations provided above, which also apply in this case. In contrast to the embodiment of FIG. 7, the embodiment of FIG. 9 includes a method step S5A being carried out, the latter being carried out instead of method step S2A. By way of example, method step S5A is carried out between method steps S1A and S3A. In method step S5A, the supply current may be changed should the first temperature of the object 125 and/or the third temperature of the object holder 114 reach/reaches or drop/drops below a first specifiable temperature value, e.g., 0° C., when changing the first temperature of the object 125 and/or the third temperature of the object holder 114. In this embodiment of the method according to the system described herein, too, the supply current may be changed in such a way that the following applies: I2>I1, where I1 is the first current value of the supply current and where I2 is the second current value of the supply current. Expressed differently, the supply current of the drive units M1 to M5 for holding the object stage 122 by means of the drive units M1 to M5 at the desired position in the sample chamber 120 may be changed in such a way that the second current value of the supply current is greater than the first current value of the supply current. As a result of this, the drive units M1 to M5 generate more heat, which may be fed to the object stage 122.

Figure 10:
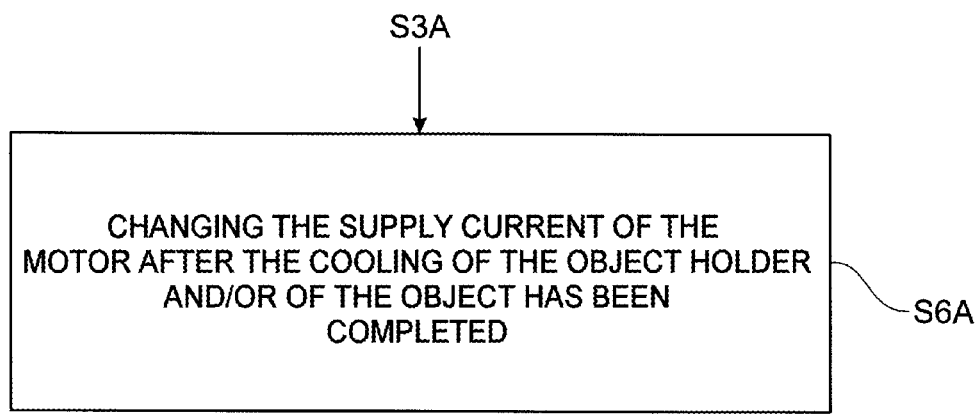
FIG. 10 shows a schematic illustration of a flowchart of a fifth embodiment of the method according to the system described herein.

FIG. 10 shows yet another embodiment of the method according to the system described herein, said embodiment being based on the embodiment of FIG. 7. Therefore, reference is initially made to the observations provided above, which also apply in this case. In contrast to the embodiment of FIG. 7, the embodiment of FIG. 10 includes a method step S6A being carried out, the latter being carried out after method step S3A, for example. After the completion of the cooling of the object holder 114 and/or of the object 125, the supply current of the drive units M1 to M5 may be changed again. By way of example, the supply current of the drive units M1 to M5 is changed back from the second current value to the first current value when two conditions are satisfied: (i) The cooling of the object holder 114 and/or of the object 125 has been completed and (ii) the first temperature of the object 125 and/or the third temperature of the object holder 114 adopt/adopts a third temperature value which lies in the range between the first temperature value and the second temperature value of the object holder 114 and/or of the object 125. Accordingly, if the first temperature of the object 125 and/or the third temperature of the object holder 114 move/moves back in the direction of the original first temperature value of the object holder 114 and/or of the object 125 (i.e., in the direction of room temperature), then the supply current of the drive units M1 to M5 may be changed from the second current value back to the original current value, specifically the first current value. As a result of this, the drive units M1 to M5 generate less heat and the object stage 122 may be consequently not heated unnecessarily.

In an alternative to statements made above, the supply current of the drive units M1 to M5 is changed back from the second current value to the first current value in a method step S6A in one embodiment of the method according to the system described herein if three conditions are satisfied: (i) The cooling of the object holder 114 and/or of the object 125 has been completed, (ii) the first temperature of the object 125 and/or the third temperature of the object holder 114 adopt/adopts a third temperature value which lies in the range between the first temperature value and the second temperature value of the object holder 114 and/or of the object 125, and (iii) a specifiable duration after the completion of the cooling of the object holder 114 and/or of the object 125 has elapsed. Expressed differently, if the cooling of the object holder 114 and/or of the object 125 has been completed and if the first temperature of the object and/or the third temperature of the object holder 114 is/are moving back in the direction of the original first temperature value (i.e., in the direction of room temperature), then the supply current of the drive units M1 to M5 may be changed from the second current value back to the original current value, specifically the first current value, after the specifiable duration has elapsed. As a result of this, too, the drive units M1 to M5 generate less heat and the object stage 122 may be consequently not heated unnecessarily.

In another alternative to statements made above, the supply current of the drive units M1 to M5 is changed from the second current value to the first current value in a method step S6A in one embodiment of the method according to the system described herein if two conditions are satisfied: (i) The cooling of the object holder 114 and/or of the object 125 has been completed and (ii) the first temperature of the object 125 and/or the third temperature of the object holder 114 reach/reaches or exceed/exceeds a specifiable temperature threshold, for example −100° C. or −80° C. or −60° C. This embodiment of the method according to the system described herein may be advantageous, in particular, if the object holder 114 and/or the object 125 heats up again after being cooled. Then, the supply current of the drive units M1 to M5 may be changed from the second current value back to the original current value, specifically the first current value. As a result of this, the drive units M1 to M5 generate less heat and the object stage 122 may be consequently not heated unnecessarily.

Figure 11:
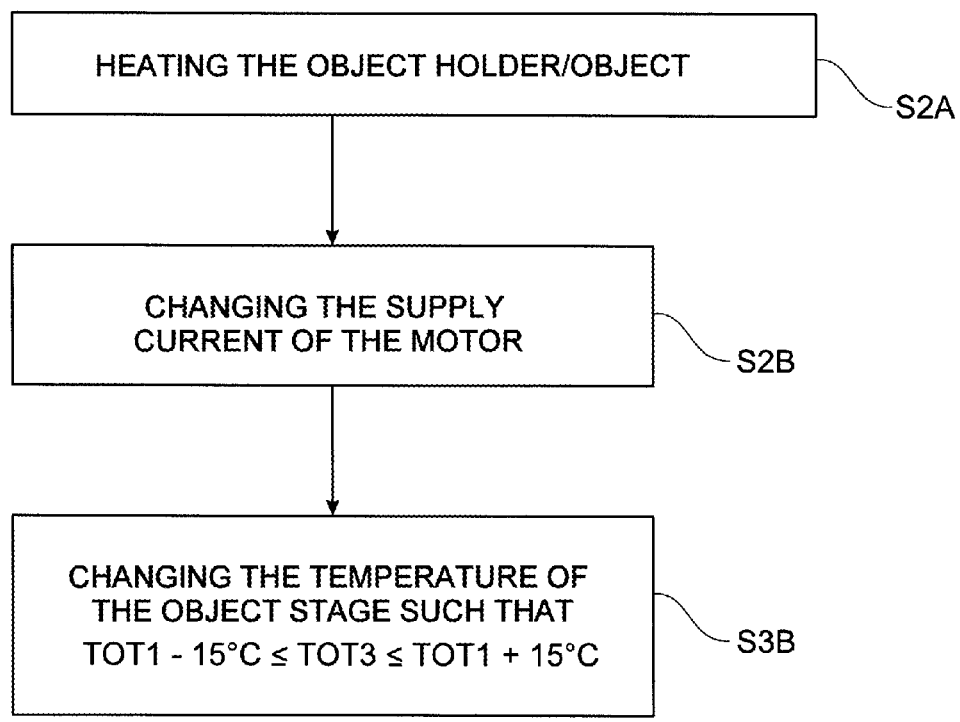
FIG. 11 shows a schematic illustration of a flowchart of a sixth embodiment of the method according to the system described herein.

FIG. 11 shows a schematic illustration of a flowchart of a further embodiment of the method according to the system described herein. The embodiment of FIG. 11 is based on the embodiment of FIG. 6. Therefore, reference is initially made to the explanations provided above, which also apply in this case. The embodiment of FIG. 11 provides for heating of the object holder 114 and/or of the object 125 in method step S1B. Accordingly, in method step S1B, the third temperature of the object holder 114, on which the object 125 may be arranged, may be increased from the first temperature value of the object holder 114 to the second temperature value of the object holder 114 by means of the cooling and/or heating device 127. Accordingly, the first temperature value of the object holder 114 may be less than the second temperature value of the object holder 114. By way of example, the first temperature value of the object holder 114 is the value of room temperature. The second temperature value of the object holder 114 is less than or equal to 40° C., for example. In addition or as an alternative thereto, in method step S1B, the first temperature of the object 125 may be increased from a first temperature value of the object 125 to a second temperature value of the object 125 by means of the cooling and/or heating device 127. Accordingly, the first temperature value of the object 125 may be less than the second temperature value of the object 125. By way of example, the first temperature value of the object 125 is the value of room temperature. By way of example, the second temperature value of the object 125 is less than or equal to 40° C.

As explained above, the changing of the first temperature of the object 125 and/or of the third temperature of the object holder 114 may bring about a change in the second temperature of the object stage 122 from the first temperature value of the object stage 122 to the second temperature value of the object stage 122. Expressed differently, a change in the first temperature of the object 125 and/or of the third temperature of the object holder 114 also may bring about a change in the second temperature of the object stage 122. In the present case, the first temperature value of the object stage 122 may be less than the second temperature value of the object stage 122. By way of example, the first temperature value of the object stage 122 is room temperature and the second temperature value of the object stage 122 is a value of approximately 5° C. to 15° C. above room temperature.

In method step S2B, the supply current of the drive units M1 to M5 may be changed from the first current value to the second current value. In the embodiment of the method according to the system described herein illustrated in FIG. 11, the supply current of the drive units M1 to M5 is changed in such a way that the following applies: I1>I2, where I1 is the first current value of the supply current and where I2 is the second current value of the supply current. Expressed differently, the supply current of the drive units M1 to M5 for holding the object stage 122 by means of the drive units M1 to M5 in the sample chamber 120 may be changed in such a way that the second current value of the supply current is less than the first current value of the supply current. As a result of this, the drive units M1 to M5 generate less heat, which may be fed to the object stage 122.

Now, the second temperature of the object stage 122 may be changed in method step S3B. In more detail, the second temperature of the object stage 122 may be changed from the second temperature value of the object stage 122 to the third temperature value of the object stage on account of the heat generated in the drive units M1 to M5, said heat being obtained by the second current value of the supply current and being fed to the object stage 122. The third temperature value of the object stage 122 may lie in the aforementioned temperature range.

In the embodiment of the method according to the system described herein illustrated in FIG. 11, provision is made, in particular, for the following to apply: TOT1<TOT2 and TOT2>TOT3, where TOT2 is the second temperature value of the object stage 122. Expressed differently, the supply current may be changed in such a way that two conditions are satisfied. Firstly, the first temperature value of the object stage 122 may be less than the second temperature value of the object stage 122. Secondly, the second temperature value of the object stage 122 may be greater than the third temperature value of the object stage 122.

In one embodiment of the method according to the system described herein as per FIG. 11, provision is additionally or alternatively made for the changing of the second temperature of the object stage 122 from the second temperature value of the object stage 122 to the third temperature value of the object stage 122 to be implemented in such a way that the third temperature value of the object stage 122 corresponds to the first temperature value of the object stage 122. Expressed differently, a change in the second temperature of the object stage 122 may be counteracted by the heat generated by the drive units M1 to M5 in such a way that the second temperature of the object stage 122 re-adopts the original temperature value or substantially the original temperature value before the first temperature of the object holder 114 was changed, the original temperature value corresponding to the first temperature value of the object stage 122. In this embodiment of the method according to the system described herein, a drift of the object stage 122 that occurred before the change in the first temperature of the object 125 and/or in the third temperature of the object holder 114 may be substantially obtained.

In a further embodiment of the method according to the system described herein as per FIG. 11, provision is made for the change of the second temperature of the object stage 122 from the second temperature value to the third temperature value to be implemented such that the following applies: TOT1≤TOT3≤TOT1+15° C. Expressed differently, the third temperature value of the object stage 122 may lie in a range which may be bounded by the first temperature value itself and by a temperature 15° C. over the first temperature value of the object stage 122. The range boundaries may be included in the range in this case.

Figure 12:
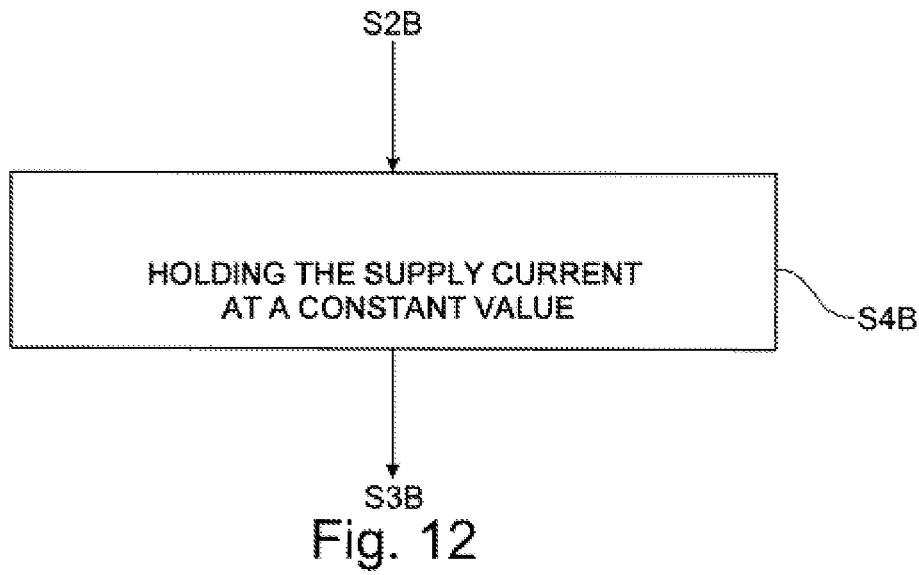
FIG. 12 shows a schematic illustration of a flowchart of a seventh embodiment of the method according to the system described herein.

FIG. 12 shows yet another embodiment of the method according to the system described herein, which is based on the embodiment of FIG. 11. Therefore, reference is initially made to the observations provided above, which also apply in this case. In contrast to the embodiment of FIG. 11, the embodiment of FIG. 12 includes a method step S4B being carried out, the latter being carried out between method steps S2B and S3B, for example. The supply current may be changed in such a way that the following applies: I1>I2, where I1 is the first current value of the supply current and where I2 is the second current value of the supply current. Once the second current value of the supply current has been reached, the supply current may be held constant at the second current value.

Figure 13:
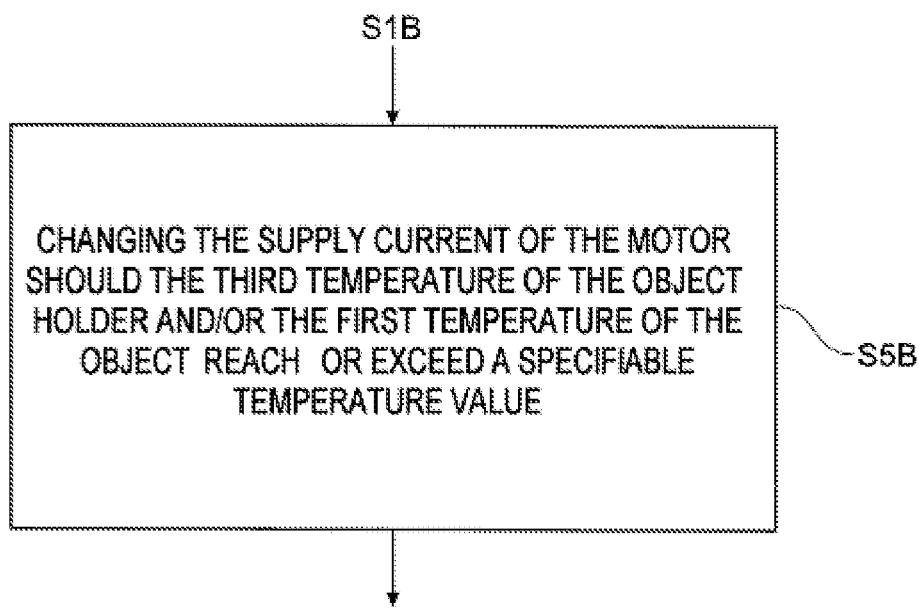
FIG. 13 shows a schematic illustration of a flowchart of an eighth embodiment of the method according to the system described herein.

FIG. 13 shows yet another embodiment of the method according to the system described herein, said embodiment being based on the embodiment of FIG. 11. Therefore, reference is initially made to the observations provided above, which also apply in this case. In contrast to the embodiment of FIG. 11, the embodiment of FIG. 13 includes a method step S5B being carried out, the latter being carried out instead of method step S2B. By way of example, method step S5B may be carried out between method steps S1B and S3B. In method step S5B, the supply current may be changed should the first temperature of the object 125 and/or the third temperature of the object holder 114 reach/reaches or exceed/exceeds a first specifiable temperature value when changing the first temperature of the object 125 and/or the third temperature of the object holder 114. In this embodiment of the method according to the system described herein, too, the supply current may be changed in such a way that the following applies: I1>I2, where I1 is the first current value of the supply current and where I2 is the second current value of the supply current. Expressed differently, the supply current of the drive units M1 to M5 for holding the object stage 122 by means of the drive units M1 to M5 at the desired position in the sample chamber 120 may be changed in such a way that the second current value of the supply current is less than the first current value of the supply current. As a result of this, the drive units M1 to M5 generate less heat, which may be fed to the object stage 122.

Figure 14:
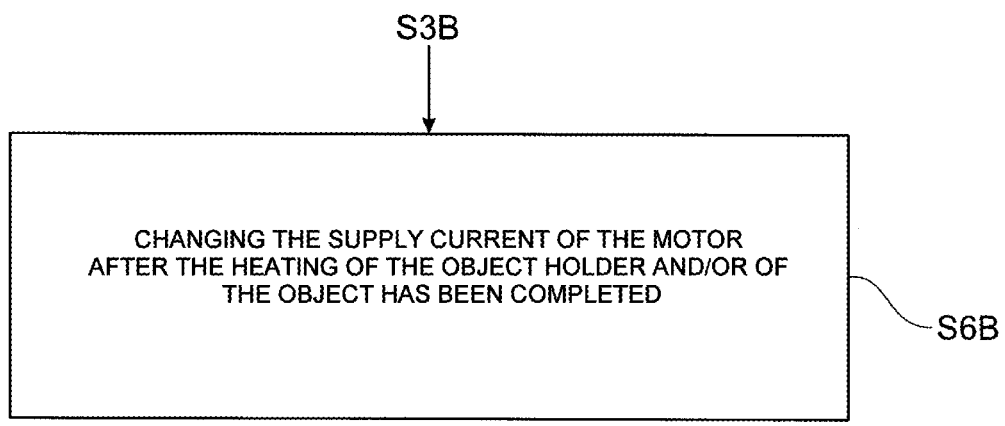
FIG. 14 shows a schematic illustration of a flowchart of a ninth embodiment of the method according to the system described herein.

FIG. 14 shows yet another embodiment of the method according to the system described herein, said embodiment being based on the embodiment of FIG. 11. Therefore, reference is initially made to the observations provided above, which also apply in this case. In contrast to the embodiment of FIG. 11, the embodiment of FIG. 14 includes a method step S6B being carried out, the latter being carried out after method step S3B, for example. After the completion of the heating of the object holder 114 and/or of the object 125, the supply current of the drive units M1 to M5 may be changed again. By way of example, the supply current of the drive units M1 to M5 is changed back from the second current value to the first current value when two conditions are satisfied: (i) The heating of the object holder 114 and/or of the object 125 has been completed and (ii) the first temperature of the object 125 and/or the third temperature of the object holder 114 adopt/adopts a third temperature value which lies in the range between the first temperature value and the second temperature value of the object holder 114 and/or of the object 125. Accordingly, if the first temperature of the object 125 and/or the third temperature of the object holder 114 may move back in the direction of the original first temperature value of the object and/or of the object holder 114 (i.e., in the direction of room temperature), then the supply current of the drive units M1 to M5 may be changed from the second current value back to the original current value, specifically the first current value. As a result of this, the drive units M1 to M5 generate more heat again.

In an alternative to statements made above, the supply current of the drive units M1 to M5 is changed back from the second current value to the first current value in a method step S6B in one embodiment of the method according to the system described herein if three conditions are satisfied: (i) The heating of the object holder 114 and/or of the object has been completed, (ii) the first temperature of the object 125 and/or of the third temperature of the object holder 114 adopt/adopts a third temperature value which lies in the range between the first temperature value and the second temperature value of the object holder 114 and/or of the object 125, and (iii) a specifiable duration after the completion of the heating of the object holder 114 and/or of the object 125 has elapsed. Expressed differently, if the heating of the object holder 114 and/or of the object 125 has been completed and if the first temperature of the object 125 and/or the third temperature of the object holder 114 is/are moving back in the direction of the original first temperature value (i.e., in the direction of room temperature), then the supply current of the drive units M1 to M5 may be changed from the second current value back to the original current value, specifically the first current value, after the specifiable duration has elapsed. As a result of this, too, the drive units M1 to M5 generate more heat again.

In another alternative to statements made above, the supply current of the drive units M1 to M5 is changed from the second current value to the first current value in a method step S6B in one embodiment of the method according to the system described herein if two conditions are satisfied: (i) The heating of the object holder 114 and/or of the object 125 has been completed and (ii) the first temperature of the object 125 and/or the third temperature of the object holder 114 reach/reaches or drop/drops below a specifiable temperature threshold, for example 35° C. or 32° C. or 30° C. Then, the supply current of the drive units M1 to M5 may be changed from the second current value back to the original current value, specifically the first current value. As a result of this, the drive units M1 to M5 generate more heat again.

As mentioned further above, in a further embodiment of the SEM 100, provision is made for the object holder 114 to be embodied as an object receiving device, for example in the form of a manipulator and/or a gripper for holding the object 125. The object holder 114 then may have a movable embodiment, for example as explained above and further below in respect of the object stage 122. An embodiment of the method according to the system described herein in respect of this further embodiment of the SEM 100 is described below. Initially, a first temperature of the object 125 may be changed from a first temperature value of the object 125 to a second temperature value of the object 125 by means of the cooling and/or heating device 127. By way of example, the object 125 may be cooled and/or heated from the first temperature value of the object 125 to the second temperature value of the object 125. The changing of the first temperature of the object 125 may bring about a change in the third temperature of the object holder 114 from a first temperature value of the object holder 114 to a second temperature value of the object holder 114. Expressed differently, a change in the first temperature of the object 125 also may bring about a change in the third temperature of the object holder 114.

Then, the supply current of the drive units M1 to M5 of the object holder 114 may be changed from a first current value to a second current value. The object holder 114 may be held at the desired position in the sample chamber 120 by the drive units M1 to M5 in the case of both the first current value and the second current value of the supply current. Consequently, the aforementioned supply current may be a holding current. Expressed differently, the object holder 114 may be held at the desired position in the sample chamber 120 by the drive units M1 to M5 when the supply current has the first current value or the second current value.

Further, the third temperature of the object holder 114 may be now changed. In more detail, the third temperature of the object holder 114 may be changed from the second temperature value of the object holder 114 to a third temperature value of the object holder 114 on account of heat generated by the drive units M1 to M5, said heat being obtained by the second current value of the supply current and being fed to the object holder 114. The third temperature value of the object holder 114 may lie in a temperature range, to which the following applies:

$$TOT1-15° C. \leq TOT3 \leq TOT1+15° C., \quad [1]$$

where
TOT1 is the first temperature value of the object holder 114, and where
TOT3 is the third temperature value of the object holder 114.

Expressed differently, the third temperature value of the object holder 114 may lie in a range of ±15° C. around the first temperature value of the object holder 114. This embodiment of the method according to the system described herein may have the variants already explained further above in respect of the further embodiments of the method according to the system described herein.

Figure 17:
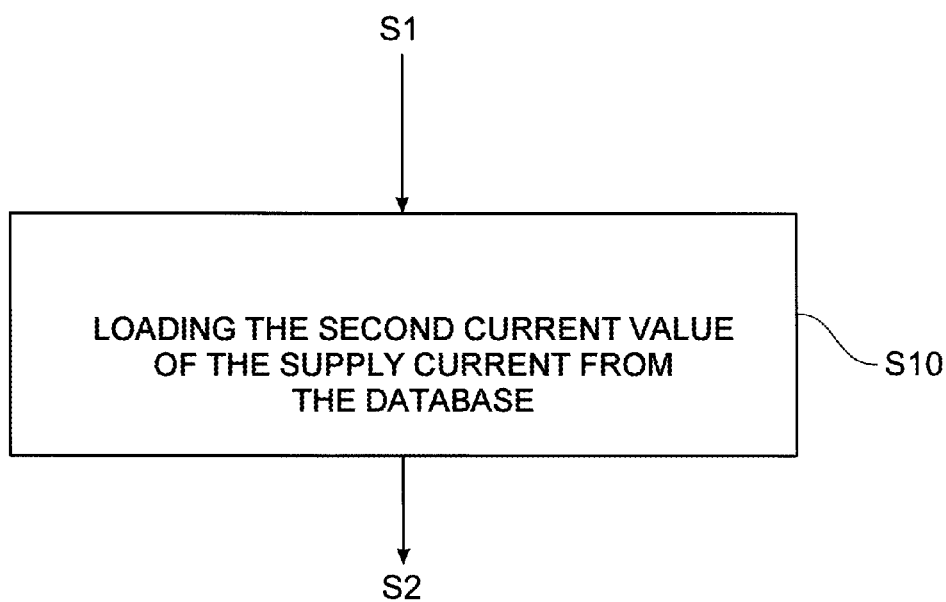
FIG. 17 shows a schematic illustration of a flowchart of a tenth embodiment of the method according to the system described herein.

In a further embodiment of the method according to the system described herein, provision is made for the value that the second current value of the supply current should have so that the second temperature of the object stage 122 has the third temperature value to be determined before the first temperature of the object 125 and/or the third temperature of the object holder 114 may be changed. This is explained below with reference to the third temperature of the object holder 114. A corresponding statement applies in respect of the first temperature of the object 125. This method step of the embodiment of the method according to the system described herein need not necessarily be carried out by a user of the SEM 100. Rather, this method step also may be undertaken in the factory of a producer of the SEM 100. By way of example, provision is made for values for the second current value of the supply current to be stored in the database 126 as a function of the second temperature value of the object holder 114 and of the third temperature value of the object stage 122 to be obtained. Then, following method step S1 as per FIG. 6 and in a method step S10 (cf. FIG. 17), the second current value of the supply current may be initially loaded into the control unit 123 of the SEM 100 from the database 126 on the basis of the second temperature value of the object holder 114 and on the basis of the desired third temperature value of the object stage 122. Subsequently, the method steps S2 and S3 as per FIG. 6 may be carried out. The loaded second current value of the supply current then may be fed to the drive units M1 to M5.

In one embodiment of the method according to the system described herein, determining the second current value of the supply current includes the following steps:
setting the third temperature of the object holder 114 to a plurality of different second temperature values of the object holder 114; and
determining the second current value of the supply current for each of the plurality of different second temperature values of the object holder 114, wherein a change of the second temperature of the object stage 122 from the second temperature value of the object stage 122 to the third temperature value of the object stage 122 may be obtained when the determined second current value is fed to the drive units M1 to M5.

Figure 15:
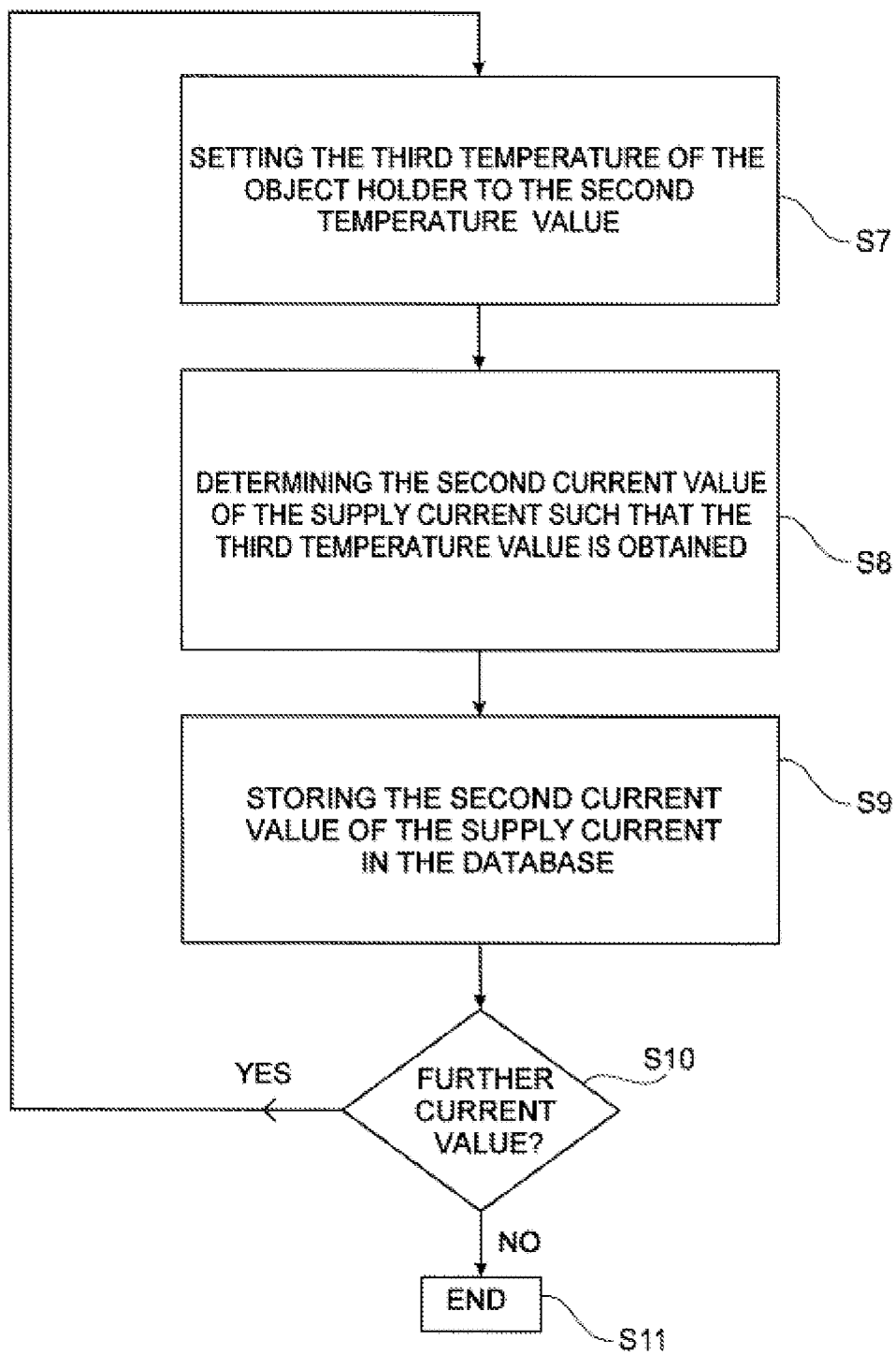
FIG. 15 shows a schematic illustration of a flowchart of an embodiment of the method according to the system described herein for determining current values.
Figure 16:
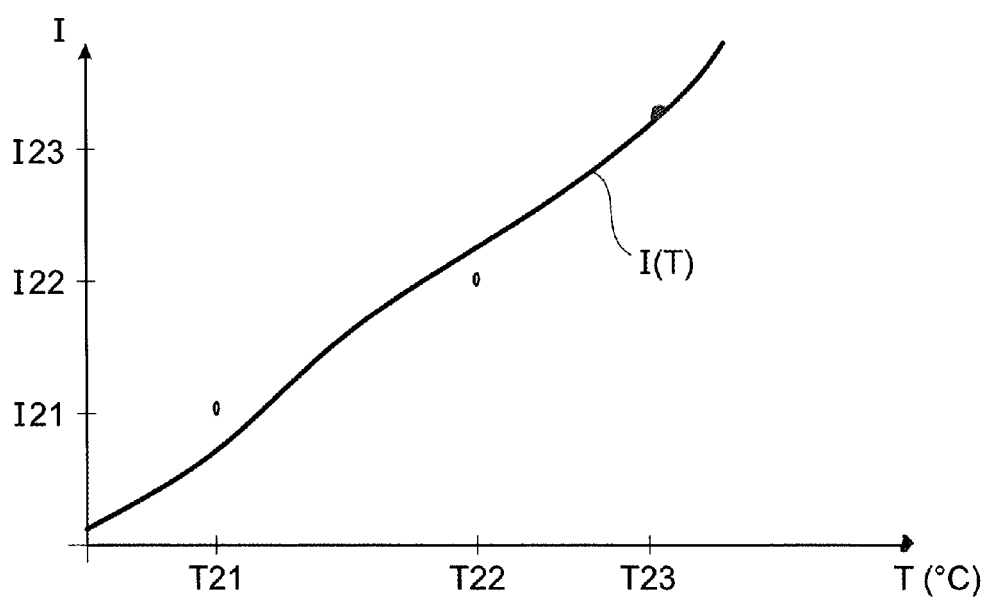
FIG. 16 shows a schematic illustration of current values of a supply current of a motor as a function of the temperature of an object holder, according to an embodiment of the system described herein.

This is elucidated by the flowchart of FIG. 15. In method step S7, the third temperature of the object holder 114 may be set to a second temperature value, for example the value T21. Then, the second current value of the supply current such that a certain specified third temperature value of the object stage 122 may be obtained may be determined in method step S8. By way of example, this is the second current value I21. FIG. 16 shows a schematic illustration of the second current value of the supply current as a function of the second temperature value of the object holder 114 for a given specified third temperature value of the object stage 122.

Once the second current value of the supply current has been determined, the second current value of the supply current may be stored in the database 126 in method step S9. In method step S10, a check may be carried out as to whether a further second current value of the supply current should be determined. If a further second current value of the supply current should be determined, then method steps S7 to S9 may be repeated. In this way, further second current values of the supply current may be determined as a function of the second temperature value of the object holder 114. By way of example, a second current value I22 is determined for the second temperature value T22 of the object holder 114. Further, a second current value I23 may be determined for the second temperature value T23 of the object holder 114.

In this embodiment of the method according to the system described herein, provision is made for a functional relationship I(T) to be ascertained for the second current value of the supply current as a function of the second temperature value of the object holder 114 for a given specified third temperature value of the object stage 122. Then, the functional relationship may be used to determine the second current value of the supply current required for the second temperature of the object stage 122 to adopt the third temperature value, for any second temperature value of the object holder 114. The functional relationship may be determined by extrapolation and/or interpolation. Any suitable interpolation method, for example a linear interpolation, a nonlinear interpolation, a trigonometric interpolation, a logarithmic interpolation and/or a spline interpolation, may be used in the interpolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the first value and the second value.

If it is necessary to measure the temperature of the object holder 114, of the object 125 and/or of the object stage 122, then this may be carried out using the temperature measuring unit 128.

All embodiments of the method according to the system described herein have the advantages already explained further above. Reference is made thereto at this point.

The features of the system described herein disclosed in the present description, in the drawings and in the claims may be essential for the realization of the invention in the various embodiments thereof, both individually and in arbitrary combinations. The invention is not restricted to the described embodiments. It may be varied within the scope of the claims and taking into account the knowledge of the relevant person skilled in the art. Other embodiments of the invention will be apparent to those skilled in the art from a consideration of the specification and/or an attempt to put into practice the system described herein. It is intended that the specification and examples be considered as illustrative only, with the true scope and spirit of the invention being indicated by the following claims.

The invention claimed is:

1. A method of operating a particle beam apparatus and/or a light microscope for imaging, analyzing and/or processing an object, the method comprising:
   changing a first temperature of the object, wherein the object is arranged on an object receiving device rendered movable by at least one motor operated by a supply current, wherein changing the first temperature of the object brings about a change in a second temperature of the object receiving device from a first temperature value of the object receiving device to a second temperature value of the object receiving device;
   changing the supply current of the motor from a first current value to a second current value, wherein, both at the first current value and the second current value, the supply current is used to hold the object receiving device by means of the motor at a position in the particle beam apparatus and/or in the light microscope; and
   changing the second temperature of the object receiving device from the second temperature value of the object receiving device to a third temperature value of the object receiving device on account of heat generated by the motor, which is obtained by the second current value of the supply current and fed to the object receiving device, wherein the third temperature value of the object receiving device is located in a temperature range to which the following applies:

$$TOT1-15°\ C. \leq TOT3 \leq TOT1+15°\ C.,$$

where TOT1 is the first temperature value of the object receiving device, and where TOT3 is the third temperature value of the object receiving device.

2. The method as claimed in claim 1, the method further comprising:
   arranging the object on an object holder;
   arranging the object holder on the object receiving device; and
   changing the first temperature of the object by changing a third temperature of the object holder from a first temperature value of the object holder to a second temperature value of the object holder.

3. The method as claimed in claim 2, wherein the third temperature of the object holder is changed by cooling or heating the object holder.

4. The method as claimed in claim 2, wherein the method includes one of the following:
   (i) should the third temperature of the object holder reach or drop below a first specifiable temperature value when changing the third temperature of the object holder, the supply current is changed in such a way that the following applies: I2>I1, where I1 is the first current value of the supply current and where I2 is the second current value of the supply current; and
   (ii) should the third temperature of the object holder reach or exceed a second specifiable temperature value when changing the third temperature of the object holder, the supply current is changed in such a way that the following applies: I1>I2, where I1 is the first current value of the supply current and where I2 is the second current value of the supply current.

5. The method as claimed in claim 2, wherein the method includes one of the following:
   (i) after changing of the third temperature of the object holder has been completed and if the third temperature of the object holder adopts a third temperature value lying in the region between the first temperature value and the second temperature value of the object holder, the supply current of the motor is changed from the second current value to the first current value;
   (ii) after a specifiable duration following the completion of the change of the third temperature of the object holder and if the third temperature of the object holder adopts a third temperature value lying in the region between the first temperature value and the second temperature value of the object holder, the supply current of the motor is changed from the second current value to the first current value;
   (iii) should the third temperature of the object holder reach or exceed a first specifiable temperature threshold after changing the third temperature of the object holder has been completed, the supply current is changed from the second current value to the first current value; and (iv) should the third temperature of the object holder reach or drop below a second specifiable temperature threshold after changing the third temperature of the object holder has been completed, the supply current is changed from the second current value to the first current value.

6. The method as claimed in claim 2, wherein the value that the second current value of the supply current should have so that the second temperature of the object receiving device has the third temperature value is determined before the third temperature of the object holder is changed.

7. The method as claimed in claim 6, wherein determining the second current value of the supply current includes:
setting the third temperature of the object holder to a plurality of different second temperature values; and
determining the second current value for each of the plurality of different second temperature values, wherein the change of the second temperature of the object receiving device from the second temperature value of the object receiving device to the third temperature value of the object receiving device is obtained when the determined second current value is fed to the motor.

8. The method as claimed in claim 1, wherein the first temperature of the object is changed by cooling or heating the object.

9. The method as claimed in claim 1, wherein the object receiving device is moved by one of: a stepper motor or a brushless motor.

10. The method as claimed in claim 1, wherein the method includes at least one of the following:
(i) when the first temperature of the object is changed, the object is cooled and the supply current is changed in such a way that the following applies: TOT1>TOT2 and TOT2<TOT3, where TOT2 is the second temperature value of the object receiving device;
(ii) when the first temperature of the object is changed, the object is cooled using liquid nitrogen and the supply current is changed in such a way that the following applies: TOT1>TOT2 and TOT2<TOT3, where TOT2 is the second temperature value of the object receiving device; and
(iii) when the first temperature of the object is changed, the object is cooled using liquid helium and the supply current is changed in such a way that the following applies: TOT1>TOT2 and TOT2<TOT3, where TOT2 is the second temperature value of the object receiving device.

11. The method as claimed in claim 1, wherein changing the second temperature of the object receiving device from the second temperature value of the object receiving device to the third temperature value of the object receiving device is implemented in such a way that the third temperature value of the object receiving device corresponds to the first temperature value of the object receiving device.

12. The method as claimed in claim 1, wherein changing the second temperature of the object receiving device from the second temperature value to the third temperature value is implemented in such a way that one of the following relationships applies:

$$TOT1-15°\ C. \leq TOT3 \leq TOT1;\quad \text{(i)}$$

$$TOT1 \leq TOT3 \leq TOT1+15°\ C.\quad \text{(ii)}$$

13. The method as claimed in claim 1, wherein the method includes one of the following:
(i) the supply current is changed in such a way that the following applies: I2>I1, where I1 is the first current value of the supply current and where I2 is the second current value of the supply current;
(ii) the supply current is changed in such a way that the following applies: I1>I2, where I1 is the first current value of the supply current and where I2 is the second current value of the supply current;
(iii) the supply current is changed in such a way that the following applies: I2>I1, where I1 is the first current value of the supply current, where I2 is the second current value of the supply current, and wherein the supply current is kept constant at the second current value after said second current value has been reached;
(iv) the supply current is changed in such a way that the following applies: I1>I2, where I1 is the first current value of the supply current, where I2 is the second current value of the supply current, and wherein the supply current is kept constant at the second current value after said second current value has been reached;
(v) should the first temperature of the object reach or drop below a first specifiable temperature value when changing the first temperature of the object, the supply current is changed in such a way that the following applies: I2>I1, where I1 is the first current value of the supply current and where I2 is the second current value of the supply current;
(vi) should the first temperature of the object reach or exceed a second specifiable temperature value when changing the first temperature of the object, the supply current is changed in such a way that the following applies: I1>I2, where I1 is the first current value of the supply current and where I2 is the second current value of the supply current.

14. The method as claimed in claim 1, wherein the method includes one of the following:
(i) after changing of the first temperature of the object has been completed and if the first temperature of the object adopts a third temperature value lying in the region between the first temperature value and the second temperature value of the object, the supply current of the motor is changed from the second current value to the first current value;
(ii) after a specifiable duration following the completion of the change of the first temperature of the object and if the first temperature of the object adopts a third temperature value lying in the region between the first temperature value and the second temperature value of the object, the supply current of the motor is changed from the second current value to the first current value;
(iii) should the first temperature of the object reach or exceed a first specifiable temperature threshold after changing the first temperature of the object has been completed, the supply current is changed from the second current value to the first current value; and
(iv) should the first temperature of the object reach or drop below a second specifiable temperature threshold after changing the first temperature of the object has been completed, the supply current is changed from the second current value to the first current value.

15. The method as claimed in claim 1, wherein the value that the second current value of the supply current should have so that the second temperature of the object receiving device has the third temperature value is determined before the first temperature of the object is changed.

16. The method as claimed in claim 15, wherein determining the second current value of the supply current includes:
   setting the first temperature of the object to a plurality of different second temperature values; and
   determining the second current value for each of the plurality of different second temperature values, wherein the change of the second temperature of the object receiving device from the second temperature value of the object receiving device to the third temperature value of the object receiving device is obtained when the determined second current value is fed to the motor.

17. The method as claimed in claim 16, wherein determining the second current value comprises an extrapolation and/or an interpolation.

18. A computer program product comprising a program code which is loadable into a processor and which, when executed, controls a particle beam apparatus and/or a light microscope in such a way that a method of operating the particle beam apparatus and/or the light microscope for imaging, analyzing and/or processing an object is carried out, the method including:
   changing a first temperature of the object wherein the object is arranged on an object receiving device rendered movable by at least one motor operated by a supply current, wherein changing the first temperature of the object brings about a change in a second temperature of the object receiving device from a first temperature value of the object receiving device to a second temperature value of the object receiving device;
   changing the supply current of the motor from a first current value to a second current value, wherein, both at the first current value and the second current value, the supply current is used to hold the object receiving device by means of the motor at a position in the particle beam apparatus and/or in the light microscope; and
   changing the second temperature of the object receiving device from the second temperature value of the object receiving device to a third temperature value of the object receiving device on account of heat generated by the motor, which is obtained by the second current value of the supply current and fed to the object receiving device, wherein the third temperature value of the object receiving device is located in a temperature range to which the following applies:

$TOT1-15° C. \leq TOT3 \leq TOT1+15° C.$, where TOT1 is the first temperature value of the object receiving device, and where TOT3 is the third temperature value of the object receiving device.

19. A particle beam apparatus for imaging, analyzing and/or processing an object, comprising:
   at least one beam generator for generating a particle beam with charged particles;
   at least one objective lens for focusing the particle beam onto the object;
   at least one scanning device for scanning the particle beam over the object;
   at least one object holder for holding the object;
   at least one cooling and/or heating device for changing a temperature of the object holder and/or of the object;
   at least one movably embodied object receiving device, on which the object holder is arranged;
   at least one motor for moving the object receiving device;
   at least one power supply unit for supplying the motor with a supply current;
   at least one detector for detecting interaction particles and/or interaction radiation, which result/results from an interaction of the particle beam with the object;
   at least one display device for displaying the image and/or a result of the analysis of the object; and
   at least one control unit with a processor, onto which a computer program product is loaded, the computer program product comprising a program code which is loadable into a processor and which, when executed, controls the particle beam apparatus in such a way that a method of operating the particle beam apparatus for imaging, analyzing and/or processing an object is carried out, the method including:
      changing a first temperature of the object wherein the object is arranged on an object receiving device rendered movable by at least one motor operated by a supply current, wherein changing the first temperature of the object brings about a change in a second temperature of the object receiving device from a first temperature value of the object receiving device to a second temperature value of the object receiving device,
      changing the supply current of the motor from a first current value to a second current value, wherein, both at the first current value and the second current value, the supply current is used to hold the object receiving device by means of the motor at a position in the particle beam apparatus, and
      changing the second temperature of the object receiving device from the second temperature value of the object receiving device to a third temperature value of the object receiving device on account of heat generated by the motor, which is obtained by the second current value of the supply current and fed to the object receiving device, wherein the third temperature value of the object receiving device is located in a temperature range to which the following applies:

$TOT1-15° C. \leq TOT3 \leq TOT1+15° C.$, where TOT1 is the first temperature value of the object receiving device, and where TOT3 is the third temperature value of the object receiving device.

20. The particle beam apparatus as claimed in claim 19, wherein the motor for moving the object receiving device is embodied as a stepper motor and/or as a brushless motor.

21. The particle beam apparatus as claimed in claim 19, further comprising:
   at least one temperature measuring unit for measuring the temperature of the object holder and/or of the object receiving device and/or of the object.

22. The particle beam apparatus as claimed in claim 19, wherein the beam generator is embodied as a first beam generator and the particle beam is embodied as a first particle beam with first charged particles, wherein the objective lens is embodied as a first objective lens for focusing the first particle beam onto the object, and wherein the particle beam apparatus further comprises:
   at least one second beam generator for generating a second particle beam with second charged particles; and
   at least one second objective lens for focusing the second particle beam onto the object.

23. The particle beam apparatus as claimed in claim 19, wherein the particle beam apparatus is an electron beam apparatus and/or an ion beam apparatus.

24. A light microscope for imaging, analyzing and/or processing an object, comprising:
- at least one light source for generating light;
- at least one optical unit for guiding the light to the object;
- at least one object holder for holding the object;
- at least one cooling and/or heating device for changing a temperature of the object holder and/or of the object;
- at least one movably embodied object receiving device, on which the object holder is arranged;
- at least one motor for moving the object receiving device;
- at least one power supply unit for supplying the motor with a supply current; and
- a control unit which comprises a processor, onto which a computer program product is loaded, the computer program product comprising a program code which is loadable into a processor and which, when executed, controls the light microscope in such a way that a method of operating the light microscope for imaging, analyzing and/or processing an object is carried out, the method including:
  - changing a first temperature of the object wherein the object is arranged on an object receiving device rendered movable by at least one motor operated by a supply current, wherein changing the first temperature of the object brings about a change in a second temperature of the object receiving device from a first temperature value of the object receiving device to a second temperature value of the object receiving device,
  - changing the supply current of the motor from a first current value to a second current value, wherein, both at the first current value and the second current value, the supply current is used to hold the object receiving device by means of the motor at a position in the light microscope, and
  - changing the second temperature of the object receiving device from the second temperature value of the object receiving device to a third temperature value of the object receiving device on account of heat generated by the motor, which is obtained by the second current value of the supply current and fed to the object receiving device, wherein the third temperature value of the object receiving device is located in a temperature range to which the following applies:

$$TOT1-15° \text{ C.} \leq TOT3 \leq TOT1+15° \text{ C.},$$

where TOT1 is the first temperature value of the object receiving device, and where TOT3 is the third temperature value of the object receiving device.

25. The light microscope as claimed in claim 24, wherein the motor for moving the object receiving device is embodied as a stepper motor and/or as a brushless motor.

26. The light microscope as claimed in claim 24, further comprising: at least one temperature measuring unit for measuring the temperature of the object holder and/or of the object stage and/or of the object.

* * * * *